(12) United States Patent
Kanno

(10) Patent No.: US 11,221,914 B2
(45) Date of Patent: Jan. 11, 2022

(54) MEMORY SYSTEM FOR CONTROLLING NONVOLATILE MEMORY

(71) Applicant: Kioxia Corporation, Tokyo (JP)

(72) Inventor: Shinichi Kanno, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/909,015

(22) Filed: Jun. 23, 2020

(65) Prior Publication Data

US 2020/0319966 A1 Oct. 8, 2020

Related U.S. Application Data

(63) Continuation of application No. 15/820,516, filed on Nov. 22, 2017, now Pat. No. 10,719,393.

(30) Foreign Application Priority Data

Jun. 28, 2017 (JP) .............................. JP2017-126616

(51) Int. Cl.
*G06F 11/10* (2006.01)
*G06F 12/1009* (2016.01)
(Continued)

(52) U.S. Cl.
CPC .......... *G06F 11/1068* (2013.01); *G06F 3/064* (2013.01); *G06F 3/065* (2013.01); *G06F 3/0619* (2013.01); *G06F 3/0664* (2013.01); *G06F 3/0679* (2013.01); *G06F 11/1048* (2013.01); *G06F 12/0246* (2013.01); *G06F 12/1009* (2013.01); *G11C 29/52* (2013.01); *G06F 2212/1008* (2013.01); *G06F 2212/1024* (2013.01); *G06F 2212/1032* (2013.01); *G06F 2212/403* (2013.01); *G06F 2212/608* (2013.01);
(Continued)

(58) Field of Classification Search
CPC ............. G06F 11/1068; G06F 12/1009; G06F 3/0619; G06F 3/065; G06F 3/064; G11C 29/52

See application file for complete search history.

(56) References Cited

U.S. PATENT DOCUMENTS 4,628,451 A * 12/1986 Sawada ............... G06F 12/1027
711/206
5,404,478 A * 4/1995 Arai ........................ G06F 12/08
711/206
(Continued)

FOREIGN PATENT DOCUMENTS

JP 2015-162001 A 9/2015

*Primary Examiner* — Joseph D Torres
(74) *Attorney, Agent, or Firm* — Allen & Overy LLP

(57) ABSTRACT

According to one embodiment, a memory system copies content of a first logical-to-physical address translation table corresponding to a first region of a nonvolatile memory to a second logical-to-physical address translation table corresponding to a second region of the nonvolatile memory. When receiving a read request specifying a logical address in the second region, the memory system reads a part of the first data from the first region based on the second logical-to-physical address translation table. The memory system detects a block which satisfies a refresh condition from a first group of blocks allocated to the first region, corrects an error of data of the detected block and writes the corrected data back to the detected block.

20 Claims, 18 Drawing Sheets

(51) Int. Cl.
*G06F 3/06* (2006.01)
*G11C 29/52* (2006.01)
*G06F 12/02* (2006.01)

(52) U.S. Cl.
CPC .......... *G06F 2212/657* (2013.01); *G06F 2212/7201* (2013.01); *G06F 2212/7202* (2013.01); *G06F 2212/7203* (2013.01); *G06F 2212/7205* (2013.01); *G06F 2212/7207* (2013.01)

(56) References Cited

U.S. PATENT DOCUMENTS

| | | |
|---|---|---|
| 8,880,687 B1 | 11/2014 | Chandrachari et al. |
| 2003/0105921 A1 | 6/2003 | Tomita |
| 2003/0115414 A1 | 6/2003 | Tomita |
| 2003/0145167 A1* | 7/2003 | Tomita ............. G06F 3/0661 711/114 |
| 2010/0174845 A1* | 7/2010 | Gorobets ........... G06F 12/0246 711/103 |
| 2012/0246387 A1 | 9/2012 | Kanno et al. |
| 2013/0091320 A1 | 4/2013 | Kawamura et al. |
| 2013/0198439 A1 | 8/2013 | Kurotsuchi et al. |
| 2015/0242147 A1 | 8/2015 | Sakaguchi |
| 2018/0067850 A1 | 3/2018 | Kawamura et al. |

\* cited by examiner

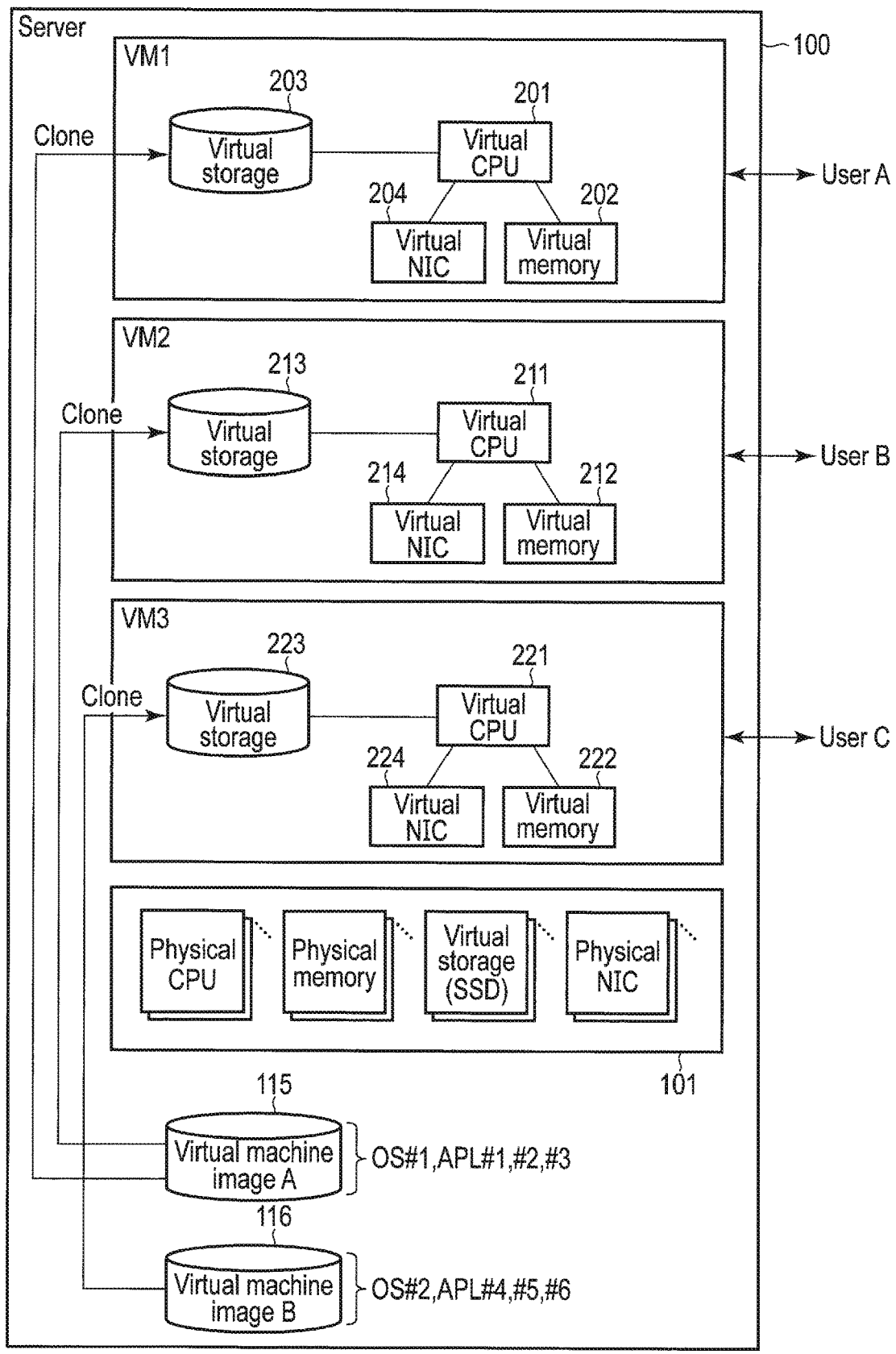
F I G. 1

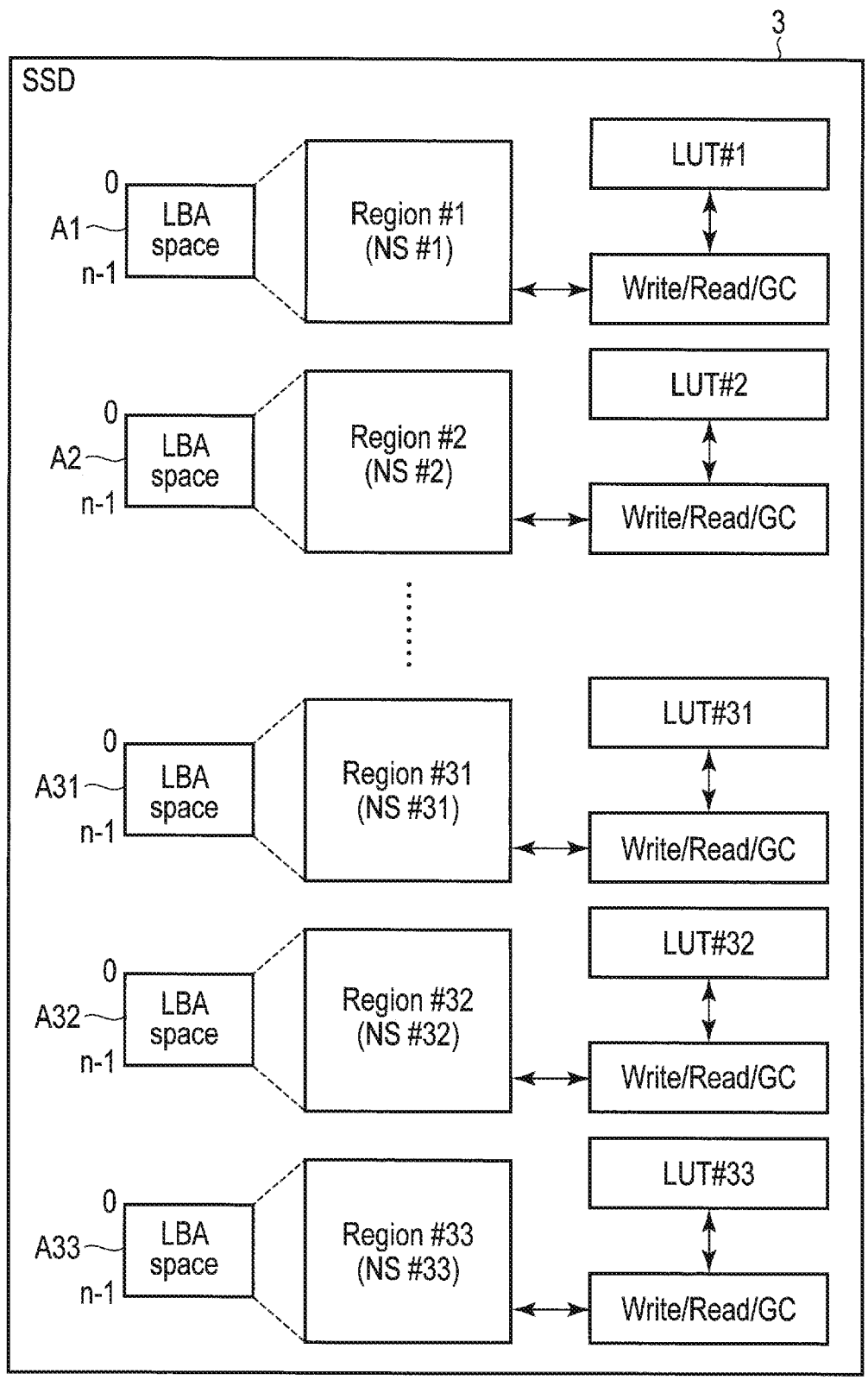
F I G. 4

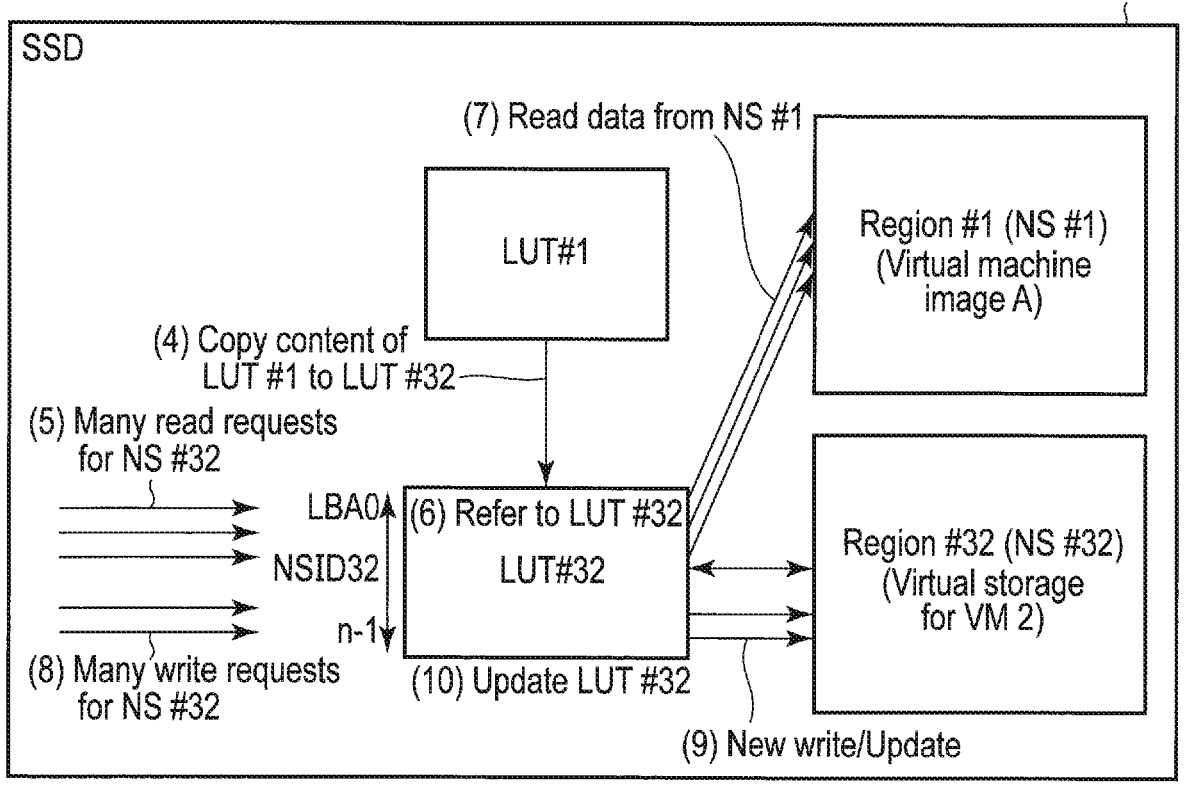
F I G. 7

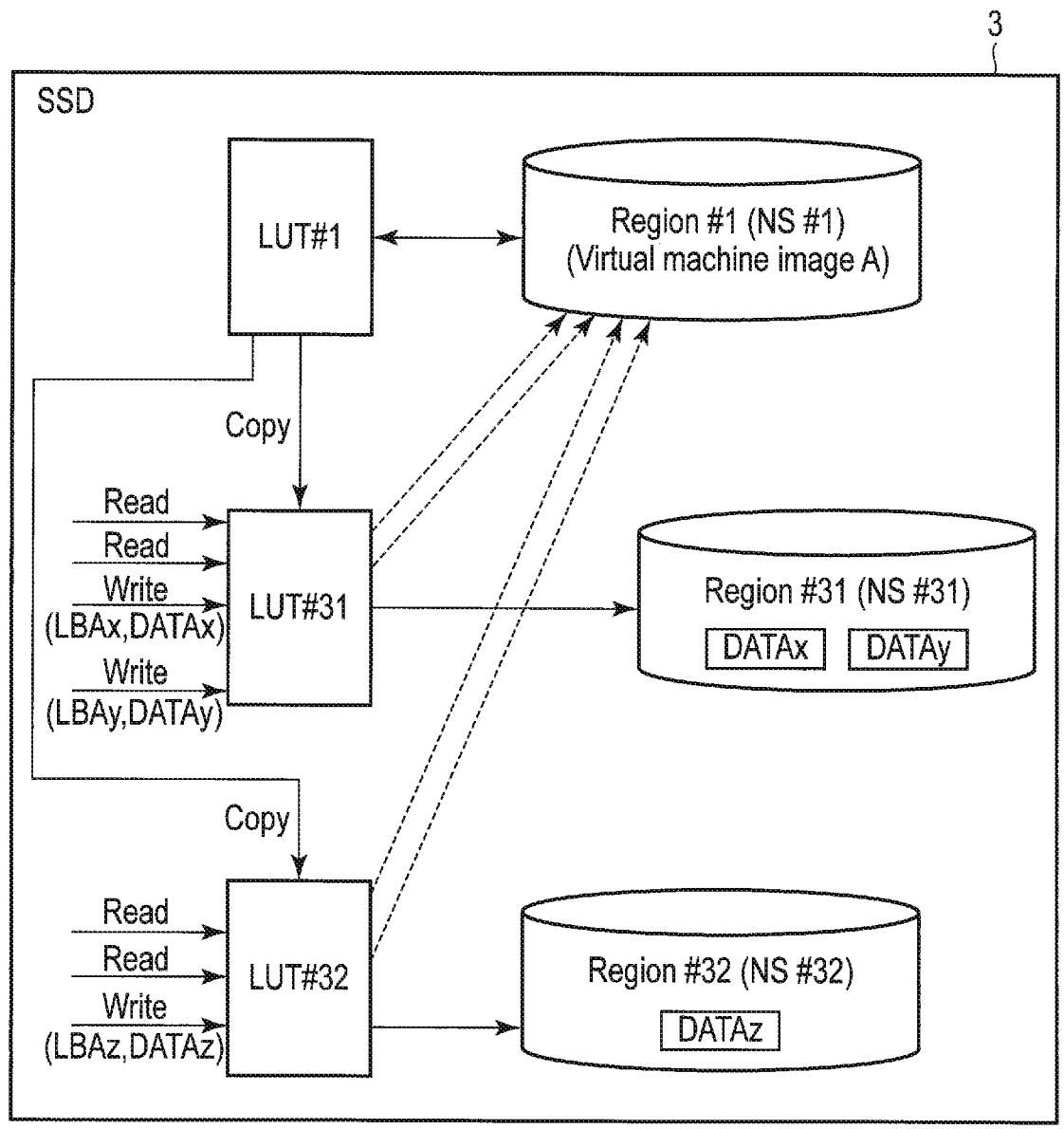
F I G. 10

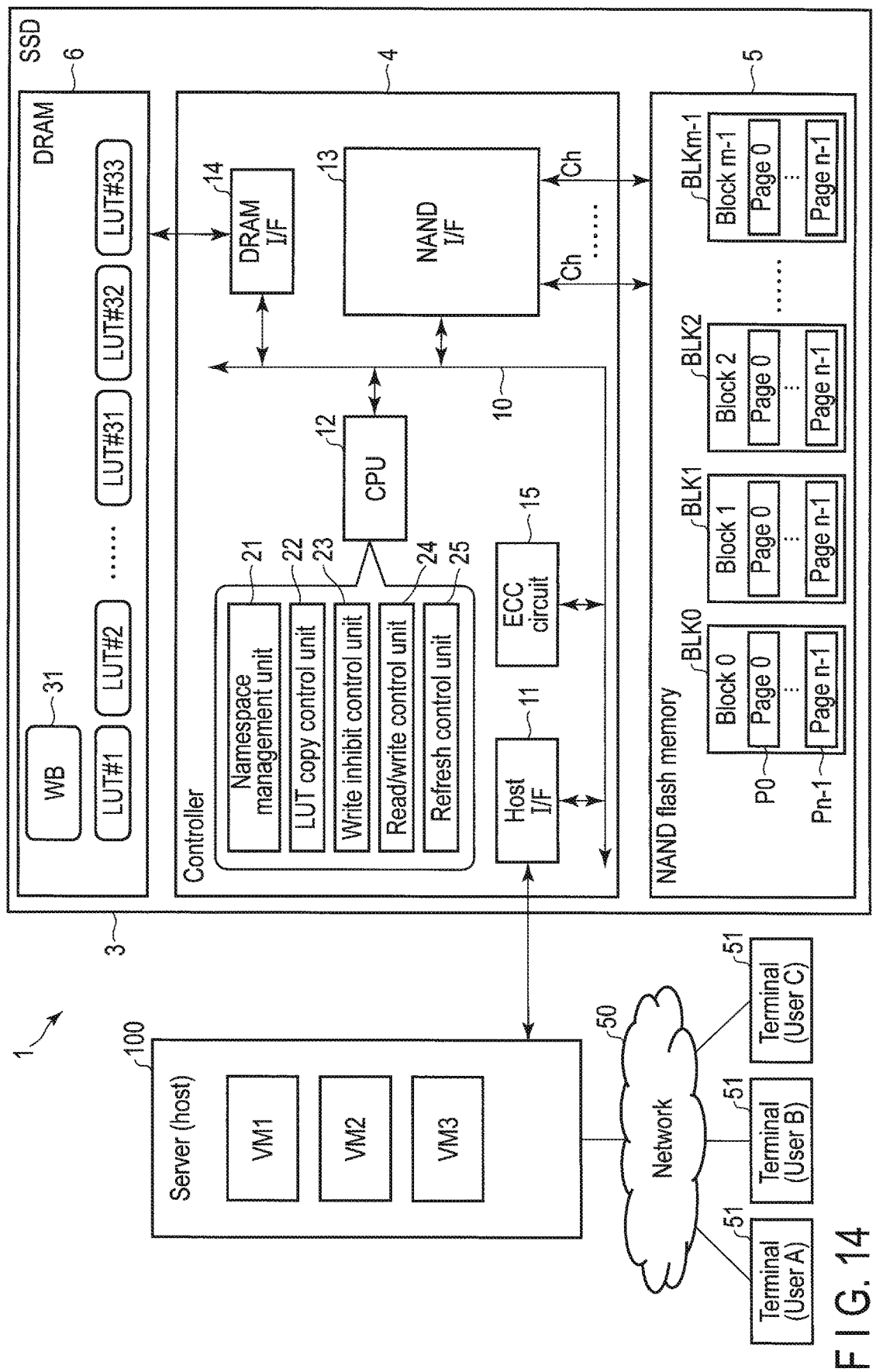
F I G. 14

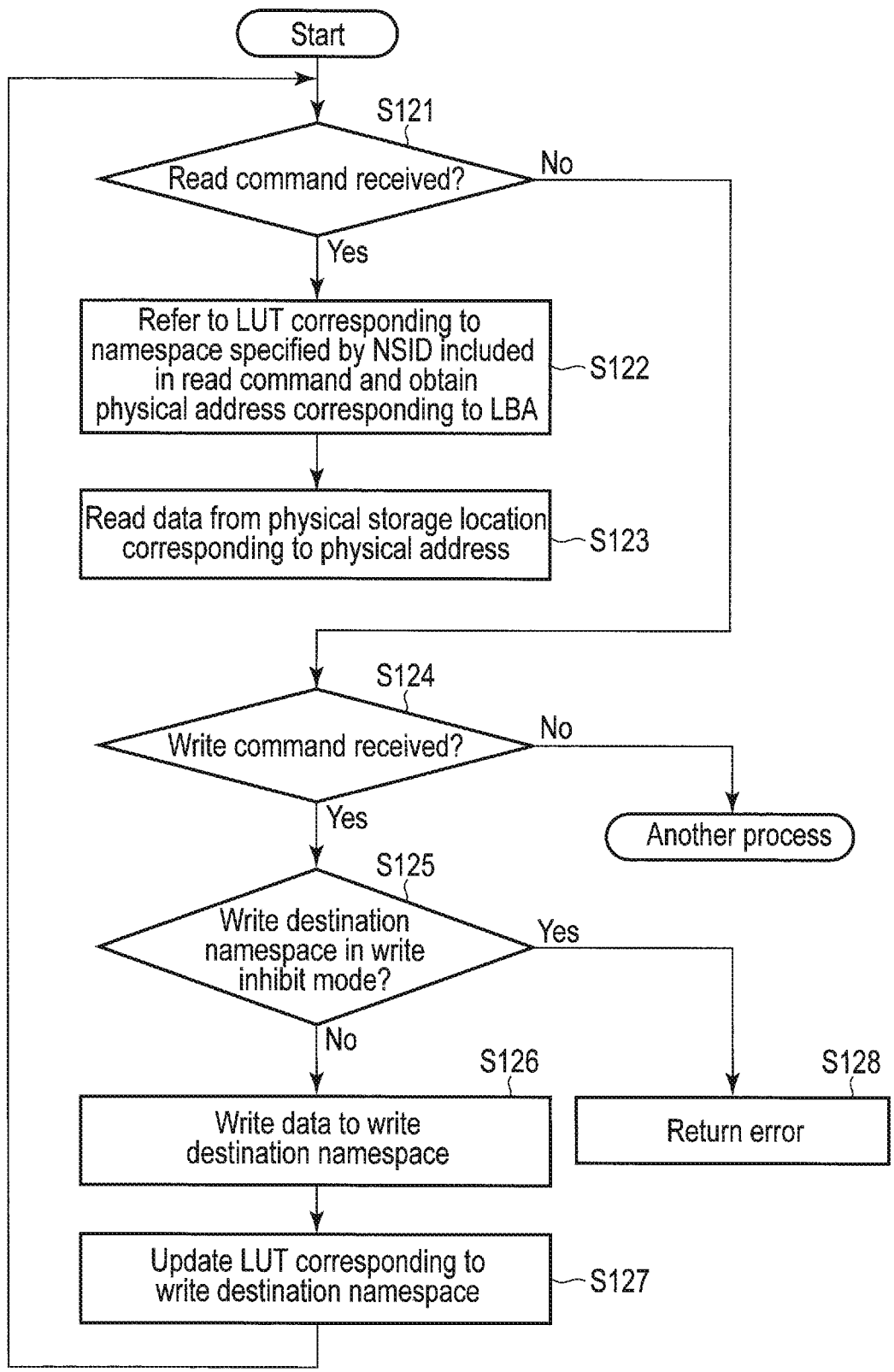
F I G. 18

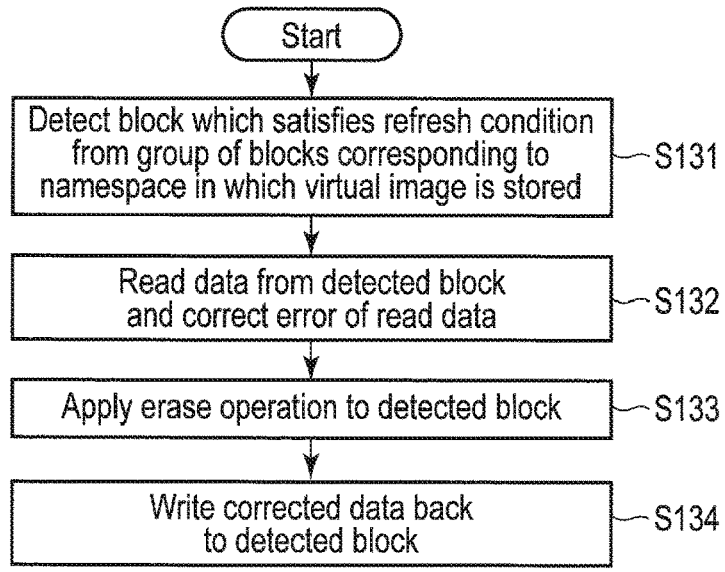
F I G. 19
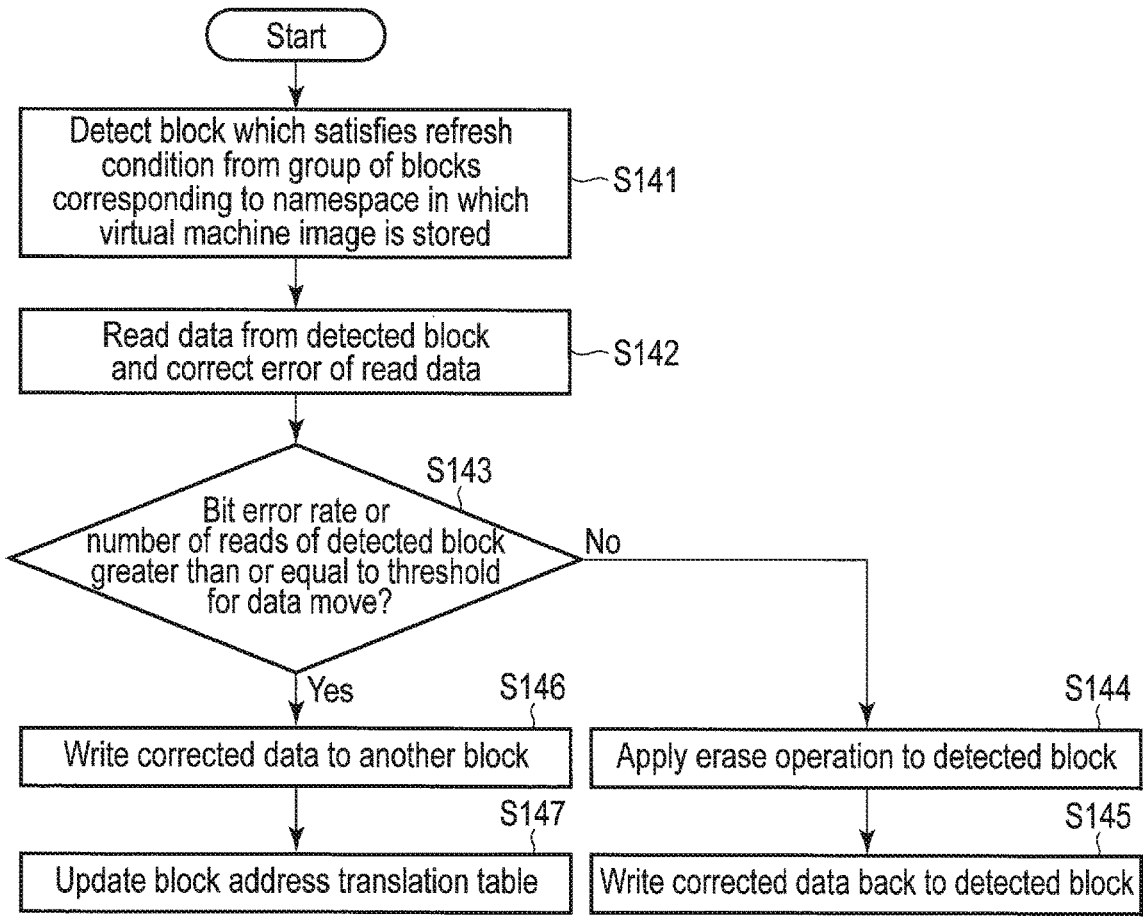
F I G. 20

MEMORY SYSTEM FOR CONTROLLING NONVOLATILE MEMORY

CROSS-REFERENCE TO RELATED APPLICATIONS

This application is a continuation of application Ser. No. 15/820,516, filed Nov. 22, 2017 and is based upon and claims the benefit of priority from Japanese Patent Application No. 2017-126616, filed Jun. 28, 2017, the entire contents of which are incorporated herein by reference.

FIELD

Embodiments described herein relate generally to a technology for controlling a nonvolatile memory.

BACKGROUND

In recent years, memory systems comprising nonvolatile memories have become widespread.

As one of the above memory systems, a solid-state drive (SSD) based on NAND flash technology is known.

A memory system such as an SSD may be required to copy the data stored in a region to another region.

However, in many cases, the above copying process requires relatively a lot of time.

BRIEF DESCRIPTION OF THE DRAWINGS

FIG. 1 a block diagram illustrating a configuration example of a server (host computing device).

FIG. 4 is a block diagram illustrating the relationships of a plurality of regions in the memory system of the embodiment, logical address spaces corresponding to the regions and lookup tables corresponding to the regions.

FIG. 7 is illustrated to explain the operation for controlling region #32 in the memory system of the embodiment.

FIG. 10 is illustrated to explain a read operation performed in response to a read request specifying a logical address in region #31 (or region #32) and a write operation performed in response to a write request specifying a logical address in region #31 (or region #32).

FIG. 14 is a block diagram illustrating a configuration example of an information processing system including the host computing device and the memory system of the embodiment.

FIG. 18 is a flowchart illustrating the procedure of a read/write process performed by the memory system of the embodiment.

FIG. 19 is a flowchart illustrating an example of the procedure of a refresh process performed by the memory system of the embodiment.

FIG. 20 is a flowchart illustrating another example of the procedure of a refresh process performed by the memory system of the embodiment.

DETAILED DESCRIPTION

Figure 2:
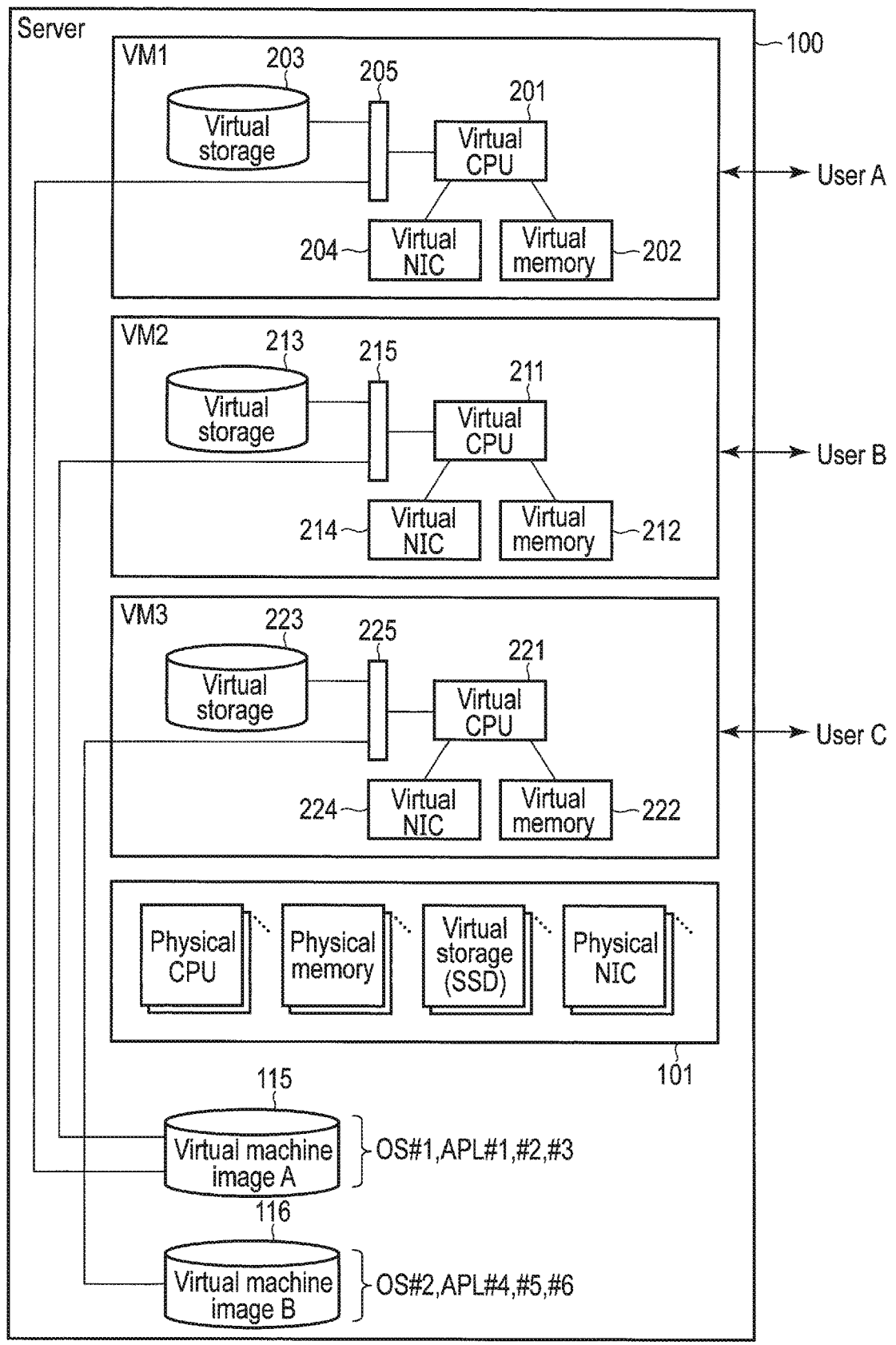
FIG. 2 is a block diagram for explaining the operation of an access destination switching unit provided in each virtual machine of the server of FIG. 1.

Various embodiments will be described hereinafter with reference to the accompanying drawings.

In general, according to one embodiment, a memory system connectable to a host computing device comprises a nonvolatile memory including a plurality of blocks, and a controller electrically connected to the nonvolatile memory. The controller manages a plurality of regions in the nonvolatile memory. The regions include a first region storing first data referred to by another region and a second region referring to the first data. The controller copies content of a first logical-to-physical address translation table corresponding to the first region to a second logical-to-physical address translation table corresponding to the second region in response to a request from the host computing device. When receiving a read request specifying a logical address in the second region from the host computing device, the controller reads a part of the first data from the first region based on the second logical-to-physical address translation table, and returns the read data to the host computing device. When receiving a write request specifying a logical address in the second region from the host computing device, the controller writes, to the second region, second data to be written, and updates the second logical-to-physical address translation table such that a physical address indicating a physical storage location to which the second data is written in the second region is mapped to the logical address specified by the write request. The controller detects a block which satisfies a refresh condition from a first group of blocks in the nonvolatile memory allocated to the first region, corrects an error of data of the detected block and writes the corrected data back to the detected block.

FIG. 1 illustrates a configuration example of a computing device to which a memory system is applicable according to one embodiment. The computing device is a data processing device which executes various programs, such as a server or a personal computer. In the following explanation, it is assumed that the computing device is realized as a server 100.

The server 100 is a computing device (physical server) which provides a plurality of users (terminals) with various services via a network.

The server 100 may be provided in a data center. An example of the services provided by the server 100 is an Infrastructure as a Service (IaaS), which provides a large number of users (tenants) with an infrastructure such as a virtual server.

The server 100 includes a virtualized environment in which a plurality of virtual machines are executed. The virtual machines are executed on the server 100. FIG. 1 illustrates a case where three virtual machines VM1, VM2 and VM3 are executed on the server 100.

Virtual machines VM1, VM2 and VM3 function as virtual servers configured to provide users A, B and C corresponding to virtual machines VM1, VM2 and VM3, respectively, with various services.

Virtual machines VM1, VM2 and VM3 share physical resources 101 in the server 100. The physical resources 101 normally include at least one physical CPU, a physical memory including at least one physical memory module, at least one physical storage unit, at least one physical network interface card (physical NIC), etc. Each physical storage unit may be a storage device using a nonvolatile memory such as a NAND flash memory as a storage medium. The storage device may be either a solid-state drive (SSD) or a flash array including a plurality of storage units each including a nonvolatile memory.

Each virtual machine VM may comprise a virtual CPU, a virtual memory, a virtual storage (which is also called a virtual disk) and a virtual NIC.

FIG. 1 illustrates a case where: virtual machine VM1 provided to user A includes a virtual CPU 201, a virtual memory 202, a virtual storage 203 and a virtual NIC 204; virtual machine VM2 provided to user B includes a virtual CPU 211, a virtual memory 212, a virtual storage 213 and a virtual NIC 214; and virtual machine VM3 provided to user C includes a virtual CPU 221, a virtual memory 222, a virtual storage 223 and a virtual NIC 224.

A user who wishes to use a virtual machine (virtual server) can specify the performance, properties, etc., of the virtual machine (virtual sever) to be used. More specifically, the user can specify the desired performance (for example, the CPU speed and the number of CPU cores), the desired memory (DRAM) capacity, the desired network performance (for example, the number of NICs), the desired storage capacity, the type of the operating system to be used, the type of the application program to be used, etc.

For example, if user A selects a certain type of operating system when virtual machine VM1 is to be created, the binary image of the selected operating system may be installed into virtual storage 203 for virtual machine VM1.

However, normally, it requires relatively a lot of time to install an operating system into virtual storage 203.

Thus, some types of virtual machine images may be prepared as templates in advance in the server 100.

FIG. 1 illustrates a case where a disk 115 into which a certain type of operating system (OS #1) is installed as virtual machine image A (in other words, as a template) and a disk 116 into which another type of operating system (OS #2) is installed as virtual machine image B (in other words, as another template) are prepared in advance.

When user A selects virtual machine image A, the binary image of the operating system (OS #1), in other words, the install image of the operating system (OS #1) is copied from disk 115 to virtual storage 203 of virtual machine VM1.

In addition to the install image of the operating system (OS #1), virtual machine image A may include the install images of some application programs (APLs #1, #2 and #3).

In addition to the install image of the operating system (OS #2), virtual machine image B may include the install images of some application programs (APLs #4, #5 and #6).

Each user can select an arbitrary machine image from a plurality of virtual machine images prepared as templates (here, virtual machine images A and B).

For example, when user A selects virtual machine image A, the clone of virtual machine image A is (specifically, OS #1 and APLs #1, #2 and #3 are) copied from disk 115 to virtual storage 203 of virtual machine VM1. The operating system (OS #1) copied to virtual storage 203 is executed as the guest operating system for virtual machine VM1. In other words, virtual machine VM1 accesses virtual storage 203 and executes the operating system (OS #1) in virtual storage 203.

Similarly, when user B selects virtual machine image A, the clone of virtual machine image A is (specifically, OS #1 and APLs #1, #2 and #3 are) copied from disk 115 to virtual storage 213 of virtual machine VM2. The operating system (OS #1) copied to virtual storage 213 is executed as the guest operating system for virtual machine VM2. In other words, virtual machine VM2 accesses virtual storage 213 and executes the operating system (OS #1) in virtual storage 213.

When user C selects virtual machine image B, the clone of virtual machine image B is (specifically, OS #2 and APLs #4, #5 and #6 are) copied from disk 116 to virtual storage 223 of virtual machine VM3. The operating system (OS #2) copied to virtual storage 223 is executed as the guest operating system for virtual machine VM3. In other words, virtual machine VM3 accesses virtual storage 223 and executes the operating system (OS #2) in virtual storage 223.

Thus, when the mechanism for copying the clone of a virtual machine image to a virtual storage is used, it is possible to complete setting up a virtual machine VM in a time shorter than that when an operating system is actually installed into a virtual storage.

However, normally, each virtual machine image has a relatively large size, for example, several tens of gigabytes. Thus, it takes a certain time to copy the clone of a virtual machine image from disk 115 (or disk 116) to a virtual storage.

Therefore, there is demand for a new function to further shorten the time from when a user makes a contract with the rental service of a virtual machine till when the user can actually use the virtual machine.

As shown in FIG. 2, a configuration in which each virtual machine includes an access destination switching unit may be applied to the server 100 of FIG. 1.

In the configuration of the server 100 of FIG. 2, virtual machine VM1 includes an access destination switching unit 205. Similarly, virtual machine VM2 includes an access destination switching unit 215. Virtual machine VM3 includes an access destination switching unit 225.

Each access destination switching unit accesses disk 115 or disk 116 instead of a corresponding virtual storage when the data requested by a corresponding virtual CPU is not present in the virtual storage.

For example, in virtual machine VM1, when the data to be accessed (for example, the binary image of OS #1) is not present in virtual storage 203, access destination switching unit 205 reads the data to be accessed (for example, a part of the binary image of OS #1) from disk 115 in response to a read request from virtual CPU 201.

In this way, the data of disk 115 can be used without copying the data of disk 115 to a virtual storage. In other words, the use of a virtual machine can be immediately started without copying the binary image of an operating system to a virtual storage.

In the present embodiment, disk 115 (or disk 116), a plurality of regions corresponding to virtual storages, and functions corresponding to access destination switching units can be provided by the memory system connected to the server 100.

Figure 3:
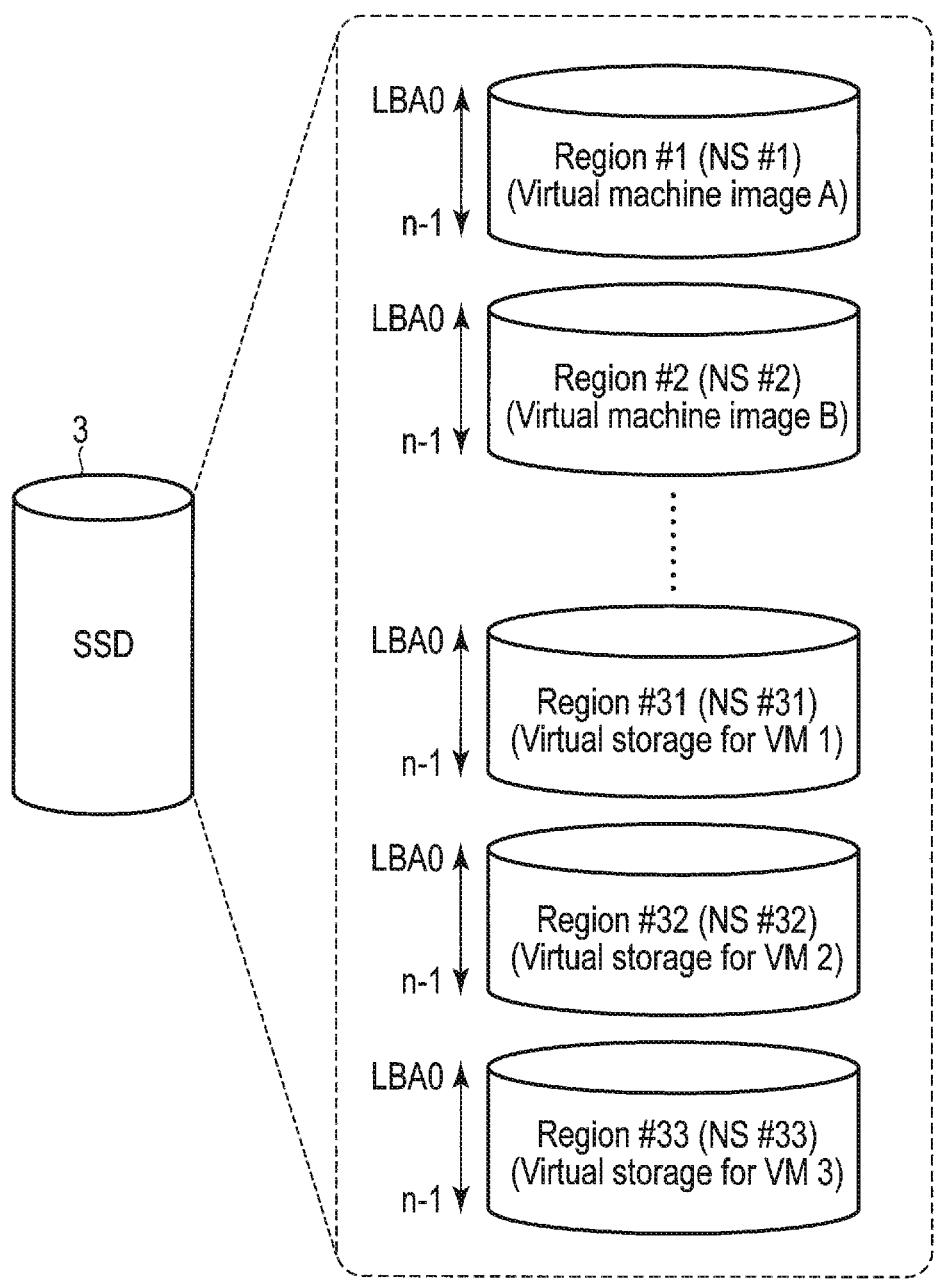
FIG. 3 is illustrated to explain a plurality of regions obtained by logically dividing a nonvolatile memory of a memory system according to an embodiment.

The memory system is a semiconductor storage device configured to write data to a nonvolatile memory and read data from the nonvolatile memory. The memory system may be either a solid-state drive (SSD) or a flash array including a plurality of storage units each including a nonvolatile memory. In the following explanation, it is assumed that the memory system is realized as, for example, a solid-state drive (SSD) 3 based on NAND flash technology as shown in FIG. 3. However, the present embodiment is not limited to this example.

The SSD 3 is applied to the server 100 of FIG. 2 as the physical storage of the server 100. The server 100 functions as a host computing device (in other words, a host or a host device) configured to transmit a read request, a write request and various other requests to the SSD 3.

The SSD 3 includes a nonvolatile memory and manages a plurality of regions in the nonvolatile memory. For example, in the SSD 3, the nonvolatile memory may be logically divided into region #1, region #2, . . . , region #31, region #32 and region #33.

Region #1 is a region for storing data (original data) which is referred to by other regions.

The original data may be the above virtual machine image A. In this case, in region #1, at least the binary image of operating system (OS) #1 is stored. Operating system (OS) #1 is used as the guest operating system for at least one virtual machine. Further, the binary images of application programs (APLs) #1, #2 and #3 may be stored in region #1.

Region #2 is also a region for storing different data (different original data) which is referred to by other regions.

The different original data may be the above virtual machine image B. In this case, in region #2, at least the binary image of operating system (OS) #2 is stored. Operating system (OS) #2 is also used as the guest operating system for at least one virtual machine. Further, the binary images of application programs (APLs) #4, #5 and #6 may be stored in region #2.

Region #31 may be a region which refers to the data (original data) of region #1.

When region #1 stores operating system (OS) #1 as original data, region #31 may be used as the virtual storage (virtual disk) accessed by virtual machine VM1 executing operating system (OS) #1.

When region #1 stores operating system (OS) #1 and application programs (APLs) #1, #2 and #3 as original data, region #31 may be used as the virtual storage (virtual disk) accessed by virtual machine VM1 executing operating system (OS) #1 and application programs (APLs) #1, #2 and #3.

Region #32 may be also a region which refers to the data (original data) of region #1.

When region #1 stores operating system (OS) #1 as original data, region #32 may be used as the virtual storage (virtual disk) accessed by virtual machine VM2 executing operating system (OS) #1.

When region #1 stores operating system (OS) #1 and application programs (APLs) #1, #2 and #3 as original data, region #32 may be used as the virtual storage (virtual disk) accessed by virtual machine VM2 executing operating system (OS) #1 and application programs (APLs) #1, #2 and #3.

In this way, the original data (templates) present in region #1 may be shared by other regions (here, regions #31 and #32).

Region #33 may be a region which refers to the data (different original data) of region #2.

When region #2 stores operating system (OS) #2 as different original data, region #33 may be used as the virtual storage (virtual disk) accessed by virtual machine VM3 executing operating system (OS) #2.

When region #2 stores operating system (OS) #2 and application programs (APLs) #4, #5 and #6 as original data, region #33 may be used as the virtual storage (virtual disk) accessed by virtual machine VM3 executing operating system (OS) #2 and application programs (APLs) #4, #5 and #6.

A plurality of logical address spaces are allocated to these regions (region #1, region #2, . . . , region #31, region #32 and region #33), respectively. As a logical address, a logical block address (LBA) may be used.

Virtual machine VM1 accesses region #31 through the logical address space of region #31. Virtual machine VM2 accesses region #32 through the logical address space of region #32. Virtual machine VM3 accesses region #33 through the logical address space of region #33.

Each region may be realized by a namespace. In this case, a plurality of namespaces are used to logically divide a nonvolatile memory such as a NAND flash memory into a plurality of regions. Each namespace is a type of region (storage region) in the nonvolatile memory. A logical address space (LBA space) is allocated to each namespace.

Each namespace is identified by the identifier of the namespace. When each region is realized by a namespace, an LBA range (LBA 0 to LBA n−1) is allocated to each region. The size of the LBA range (in other words, the number of LBAs) may differ depending on the region (namespace). Each LBA range starts from LBA 0.

FIG. 4 illustrates the relationships of a plurality of regions, logical address spaces (LBA spaces) corresponding to these regions and lookup tables corresponding to these regions.

Logical address space (LBA space) A1 with logical addresses from 0 to n−1 is allocated to region #1 corresponding to namespace NS #1. Logical address space (LBA space) A2 with logical addresses from 0 to n−1 is allocated to region #2 corresponding to namespace NS #2. Logical address space (LBA space) A31 with logical addresses from 0 to n−1 is allocated to region #31 corresponding to namespace NS #31. Logical address space (LBA space) A32 with logical addresses from 0 to n−1 is allocated to region #32 corresponding to namespace NS #32. Logical address space (LBA space) A33 with logical addresses from 0 to n−1 is allocated to region #33 corresponding to namespace NS #33.

In the present embodiment, a lookup table (LUT) is divided so as to correspond to the regions, in other words, the namespaces. In other words, LUT #1, LUT #2, . . . , LUT #31, LUT #32 and LUT #33 corresponding to region #1, region #2, . . . , region #31, region #32 and region #33, respectively, are managed by the SSD 3.

Lookup table (LUT) #1 is a logical-to-physical address translation table for managing the physical addresses of physical storage locations corresponding to the logical addresses (LBAs) of region #1, respectively, in the nonvolatile memory. Lookup table (LUT) #1 is used to manage the mapping between the logical addresses (LBAs) of region #1 and the physical addresses of the physical storage locations allocated to region #1 in the nonvolatile memory.

When the SSD 3 receives a write request (write command) specifying a logical address (LBA) in region #1 from the server (host computing device) 100, the SSD 3 writes the data to be written (write data) to region #1. The SSD 3 updates lookup table (LUT) #1 such that the physical address indicating the physical storage location to which the write data is written in region #1 is mapped to the LBA.

When the SSD 3 receives a read request (read command) specifying a logical address (LBA) in region #1 from the server (host computing device) 100, the SSD 3 refers to lookup table (LUT) #1 and obtains a physical address corresponding to the LBA from lookup table (LUT) #1. The SSD 3 reads data from the physical storage location specified by the obtained physical address.

Lookup table (LUT) #1 is also used in garbage collection for increasing the free space of region #1. In the garbage collection of region #1, the SSD 3 selects at least one block for garbage collection from the blocks allocated to region #1 in the nonvolatile memory, and copies the valid data of each selected block to another block (free block) allocated to region #1. The SSD 3 updates lookup table (LUT) #1 such that the physical addresses indicating the copy destination physical storage locations are mapped to LBAs corresponding to the copied data, respectively.

Lookup table (LUT) #2 is a logical-to-physical address translation table for managing the physical addresses of physical storage locations corresponding to the logical addresses (LBAs) of region #2, respectively, in the nonvolatile memory. Lookup table (LUT) #2 is used to manage the mapping between the logical addresses (LBAs) of region #2 and the physical addresses of the physical storage locations allocated to region #2 in the nonvolatile memory.

When the SSD 3 receives a write request (write command) specifying a logical address (LBA) in region #2 from the server (host computing device) 100, the SSD 3 writes the data to be written (write data) to region #2. The SSD 3 updates lookup table (LUT) #2 such that the physical address indicating the physical storage location to which the write data is written in region #2 is mapped to the LBA.

When the SSD 3 receives a read request (read command) specifying a logical address (LBA) in region #2 from the server (host computing device) 100, the SSD 3 refers to lookup table (LUT) #2 and obtains a physical address corresponding to the LBA from lookup table (LUT) #2. The SSD 3 reads data from the physical storage location specified by the obtained physical address.

Lookup table (LUT) #2 is also used in garbage collection for increasing the free space of region #2. In the garbage collection of region #2, the SSD 3 selects at least one block for garbage collection from the blocks allocated to region #2 in the nonvolatile memory, and copies the valid data of the selected block to another block (free block) allocated to region #2. The SSD 3 updates lookup table (LUT) #2 such that the physical addresses indicating the copy destination physical storage locations are mapped to LBAs corresponding to the copied data, respectively.

Lookup table (LUT) #31 is a logical-to-physical address translation table for managing the physical addresses of physical storage locations corresponding to the logical addresses (LBAs) of region #31, respectively, in the nonvolatile memory. Lookup table (LUT) #31 is used to manage the mapping between the logical addresses (LBAs) of region #31 and the physical addresses of the physical storage locations allocated to region #31 in the nonvolatile memory.

When the SSD 3 receives a read request (read command) specifying a logical address (LBA) in region #31 from the server 100 (virtual machine VM1 of the host computing device), the SSD 3 refers to lookup table (LUT) #31 and obtains a physical address corresponding to the LBA from lookup table (LUT) #31. The SSD 3 reads data from the physical storage location specified by the obtained physical address.

In the present embodiment, to realize the above access destination switching unit 205 provided in virtual machine VM1, the content of lookup table (LUT) #1 is copied to lookup table (LUT) #31 when virtual machine VM1 is created. Thus, in the initial state immediately after the creation of virtual machine VM1, lookup table (LUT) #31 holds the same content as lookup table (LUT) #1. In other words, each physical address in lookup table (LUT) #31 indicates a corresponding physical storage location in region #1 instead of a corresponding physical storage location in region #31. Thus, a read access to each logical address in region #31 is redirected to region #1.

Thus, when the SSD 3 receives a read request (read command) specifying a logical address (LBA) in region #31 from the server 100 (virtual machine VM1), the SSD 3 reads original data (for example, a part of OS #1) from region #1 based on lookup table (LUT) #31 and returns the read data to the server 100 (virtual machine VM1). It is possible to use all the original data stored in region #1 through the logical address space of region #31 without copying the original data of region #1 (for example, OS #1) to region #31.

When the SSD 3 receives a write request (write command) specifying a logical address (LBA) in region #31 from the server 100 (virtual machine VM1 of the host computing device), the SSD 3 writes the data to be written (write data) to region #31 (a block allocated to region #31). The SSD 3 updates lookup table (LUT) #31 such that the physical address indicating the physical storage location to which the write data is written in region #31 is mapped to the LBA.

In this manner, data writing to region #31 is not redirected to region #1. Data is written to region #31. Thus, the original data of region #1 is not updated. Only the data written to region #31 is updated. The original data of region #1 is continuously kept in the original state. Thus, even when the original data of region #1 (for example, the template of a virtual machine image) is referred to (shared) by a plurality of users, it is possible to prevent a contradiction (problem) that the data updating in a region corresponding to a user affects the data of regions corresponding to the other users.

In lookup table (LUT) #31, the physical address of a physical storage location in region #31 is mapped to a logical address corresponding to the written data. Thus, a subsequent read request specifying this logical address is not redirected to region #1, and the written data is read from region #31.

Thus, data which is not present in region #31 (in other words, original data such as OS #1) can be read from region #1. Further, new write data or update data for rewriting a part of original data can be written to region #31. For example, when it is necessary to update a part (for example, a file) of operating system (OS) #1 executed by virtual machine VM1, the updated data portion of operating system (OS) #1, in other words, the updated file is written to region #31. The user data created by the application executed by virtual machine VM1 is also written to region #31.

When data is written to region #31, the physical address of a physical storage location in region #31 is mapped to a logical address corresponding to the data. Thus, when the SSD 3 receives a subsequent read request (read command) specifying the logical address of data from the server 100 (virtual machine VM1 of the host computing device) after the data is written to region #31, the SSD 3 reads the data from region #31 based on lookup table (LUT) #31 and returns the read data to the server 100 (virtual machine VM1). In this way, the data newly written to region #31 and the updated data in region #31 can be correctly read from region #31.

Lookup table (LUT) #31 is also used in garbage collection for increasing the free space of region #31. In the garbage collection of region #31, the SSD 3 selects at least one block for garbage collection from the blocks allocated to region #31 in the nonvolatile memory, and copies the valid data of the selected block to another block (free block) allocated to region #31. The SSD 3 updates lookup table (LUT) #31 such that the physical addresses indicating the copy destination physical storage locations are mapped to LBAs corresponding to the copied data, respectively.

Lookup table (LUT) #32 is a logical-to-physical address translation table for managing the physical addresses of physical storage locations corresponding to the logical addresses (LBAs) of region #32, respectively, in the nonvolatile memory. Lookup table (LUT) #32 is used to manage the mapping between the logical addresses (LBAs) of region #32 and the physical addresses of the physical storage locations allocated to region #32 in the nonvolatile memory.

When the SSD 3 receives a read request (read command) specifying a logical address (LBA) in region #32 from the server 100 (virtual machine VM2 of the host computing device), the SSD 3 refers to lookup table (LUT) #32 and obtains a physical address corresponding to the LBA from lookup table (LUT) #32. The SSD 3 reads data from the physical storage location specified by the obtained physical address.

To realize the above access destination switching unit 215 provided in virtual machine VM2, the content of lookup table (LUT) #1 is copied to lookup table (LUT) #32 when virtual machine VM2 is created. Thus, in the initial state of virtual machine VM2, lookup table (LUT) #32 holds the same content as lookup table (LUT) #1. In other words, each physical address in lookup table (LUT) #32 indicates a corresponding physical storage location in region #1 instead of a corresponding physical storage location in region #32. Thus, a read access to region #32 is redirected to region #1.

Thus, when the SSD 3 receives a read request (read command) specifying a logical address (LBA) in region #32 from the server 100 (virtual machine VM2 of the host computing device), the SSD 3 reads original data (for example, a part of OS #1) from region #1 based on lookup table (LUT) #32 and returns the read data to the server 100 (virtual machine VM2). It is possible to use all the original data stored in region #1 through the logical address space of region #32 without copying the original data of region #1 (for example, OS #1) to region #32.

When the SSD 3 receives a write request (write command) specifying a logical address (LBA) of region #32 from the server 100 (virtual machine VM1 of the host computing device), the SSD 3 writes the data to be written (write data) to region #32 (a block allocated to region #32). The SSD 3 updates lookup table (LUT) #32 such that the physical address indicating the physical storage location to which the write data is written in region #32 is mapped to the LBA.

In this manner, data writing to region #32 is not redirected to region #1. Data is written to region #32. In lookup table (LUT) #32, the physical address of a physical storage location in region #32 is mapped to a logical address corresponding to the written data. Thus, a subsequent read request specifying this logical address is not redirected to region #1, and the written data is read from region #32.

Thus, data which is not present in region #32 (in other words, original data such as OS #1) can be read from region #1. Further, new write data or update data for rewriting a part of original data can be written to region #32. For example, when it is necessary to update a part (for example, a file) of operating system (OS) #1 executed by virtual machine VM2, the updated data portion of operating system (OS) #1, in other words, the updated file is written to region #32. The user data created by the application executed by virtual machine VM2 is also written to region #32.

When data is written to region #32, the physical address of a physical storage location in region #32 is mapped to a logical address corresponding to the data. Thus, when the SSD 3 receives a subsequent read request (read command) specifying the logical address of data from the server 100 (virtual machine VM2 of the host computing device) after the data is written to region #32, the SSD 3 reads the data from region #32 based on lookup table (LUT) #32 and returns the read data to the server 100 (virtual machine VM2).

Lookup table (LUT) #32 is also used in garbage collection for increasing the free space of region #32. In the garbage collection of region #32, the SSD 3 selects at least one block for garbage collection from the blocks allocated to region #32 in the nonvolatile memory, and copies the valid data of the selected block to another block (free block) allocated to region #32. The SSD 3 updates lookup table (LUT) #32 such that the physical addresses indicating the copy destination physical storage locations are mapped to LBAs corresponding to the copied data, respectively.

Lookup table (LUT) #33 is a logical-to-physical address translation table for managing the physical addresses of physical storage locations corresponding to the logical addresses (LBAs) of region #33, respectively, in the nonvolatile memory. Lookup table (LUT) #33 is used to manage the mapping between the logical addresses (LBAs) of region #33 and the physical addresses of the physical storage locations allocated to region #33 in the nonvolatile memory.

When the SSD 3 receives a read request (read command) specifying a logical address (LBA) in region #33 from the server 100 (virtual machine VM3 of the host computing device), the SSD 3 refers to lookup table (LUT) #33 and obtains a physical address corresponding to the LBA from lookup table (LUT) #33. The SSD 3 reads data from the physical storage location specified by the obtained physical address.

To realize the above access destination switching unit 225 provided in virtual machine VM3, the content of lookup table (LUT) #2 is copied to lookup table (LUT) #33 when virtual machine VM3 is created. Thus, in the initial state of virtual machine VM3, lookup table (LUT) #33 holds the same content as lookup table (LUT) #2. In other words, each physical address in lookup table (LUT) #33 indicates a corresponding physical storage location in region #2 instead of a corresponding physical storage location in region #33. Thus, a read access to region #33 is redirected to region #2.

Thus, when the SSD 3 receives a read request (read command) specifying a logical address (LBA) in region #33 from the server 100 (virtual machine VM3 of the host computing device), the SSD 3 reads different original data (for example, a part of OS #2) from region #2 based on lookup table (LUT) #33 and returns the read data to the server 100 (virtual machine VM3). It is possible to use all the original data stored in region #2 through the logical address space of region #33 without copying the original data of region #2 (for example, OS #2) to region #33.

When the SSD 3 receives a write request (write command) specifying a logical address (LBA) in region #33 from the server 100 (virtual machine VM3 of the host computing device), the SSD 3 writes the data to be written (write data) to region #33 (a block allocated to region #33). The SSD 3 updates lookup table (LUT) #33 such that the physical address indicating the physical storage location to which the write data is written in region #33 is mapped to the LBA.

In this manner, data writing to region #33 is not redirected to region #2. Data is written to region #33. In lookup table (LUT) #33, the physical address of a physical storage location in region #33 is mapped to a logical address corresponding to the written data. Thus, a subsequent read request specifying this logical address is not redirected to region #2, and the written data is read from region #33.

Thus, data which is not present in region #33 (in other words, different original data such as OS #2) can be read from region #2. Further, new write data or update data for rewriting a part of different original data can be written to region #33. For example, when it is necessary to update part (for example, a file) of operating system (OS) #2 executed by virtual machine VM3, the updated data portion of operating system (OS) #2, in other words, the updated file is written to region #33. The user data created by the application executed by virtual machine VM3 is also written to region #33.

When data is written to region #33, the physical address of a physical storage location in region #33 is mapped to a logical address corresponding to the data. Thus, when the SSD 3 receives a subsequent read request (read command) specifying the logical address of data from the server 100 (virtual machine VM3 of the host computing device) after the data is written to region #33, the SSD 3 reads the data from region #33 based on lookup table (LUT) #33 and returns the read data to the server 100 (virtual machine VM3).

Lookup table (LUT) #33 is also used in garbage collection for increasing the free space of region #33. In the garbage collection of region #33, the SSD 3 selects at least one block for garbage collection from the blocks allocated to region #33 in the nonvolatile memory, and copies the valid data of the selected block to another block (free block) allocated to region #33. The SSD 3 updates lookup table (LUT) #33 such that the physical addresses indicating the copy destination physical storage locations are mapped to LBAs corresponding to the copied data, respectively.

The data written to region #1 (or region #2) is not limited to a virtual machine image. Arbitrary data which is referred to by other regions may be written to region #1 (or region #2). For example, shared data such as a shared file may be written to region #1 (or region #2).

Figure 5:
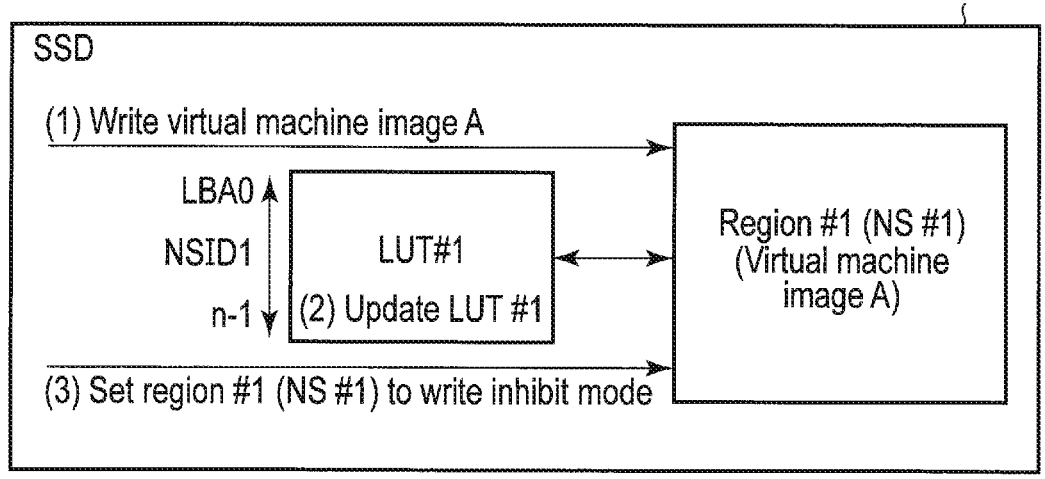
FIG. 5 is illustrated to explain the operation for writing the binary image of an operating system to region #1 in the memory system of the embodiment and the operation for setting region #1 to a write inhibit mode (read-only mode).

FIG. 5 illustrates the operation for writing the binary image of operating system (OS) #1 to region #1 and the operation for setting region #1 to a write inhibit mode (read-only mode).

(1) The server (host computing device) 100 transmits some write requests for writing original data (for example, virtual machine image A) to region #1 corresponding to namespace (NS) #1 to the SSD 3 based on the operation of the administrator of the server 100. Each write request includes the identifier (NSID 1) of namespace NS #1, a starting LBA and a transfer length. The starting LBA indicates the first LBA to which write data should be written. The transfer length indicates the length of write data.

The SSD 3 writes original data, for example, virtual machine image A (the binary image of OS #1 and the binary images of APLs #1 to #3), to region #1. In this case, the install images of operating system (OS) #1 and application programs (APLs) #1 to #3 may be copied from a disk to region #1. Alternatively, the operation for installing operating system (OS) #1 and application programs (APLs) #1 to #3 into region #1 may be performed.

(2) The SSD updates LUT #1 corresponding to NSID 1 such that the physical addresses indicating the physical storage locations to which original data (for example, virtual machine image A) is written in region #1 are mapped to LBAs corresponding to virtual machine image A.

(3) After the original data (for example, virtual machine image A) is written (installed), the SSD 3 may set region #1 to a read-only mode (write inhibit mode) for inhibiting writing to region #1. In this case, region #1 transitions from a mode for permitting both reading and writing to a read-only mode (write inhibit mode). Thus, after the original data (for example, virtual machine image A) is written (installed), new data is not written to region #1, or the data of region #1 is not rewritten. In this manner, the number of rewrites (in other words, the number of program/erase cycles) of each block allocated to region #1 in the nonvolatile memory is maintained so as to be a value less than that of the other regions used as virtual storage.

Figure 6:
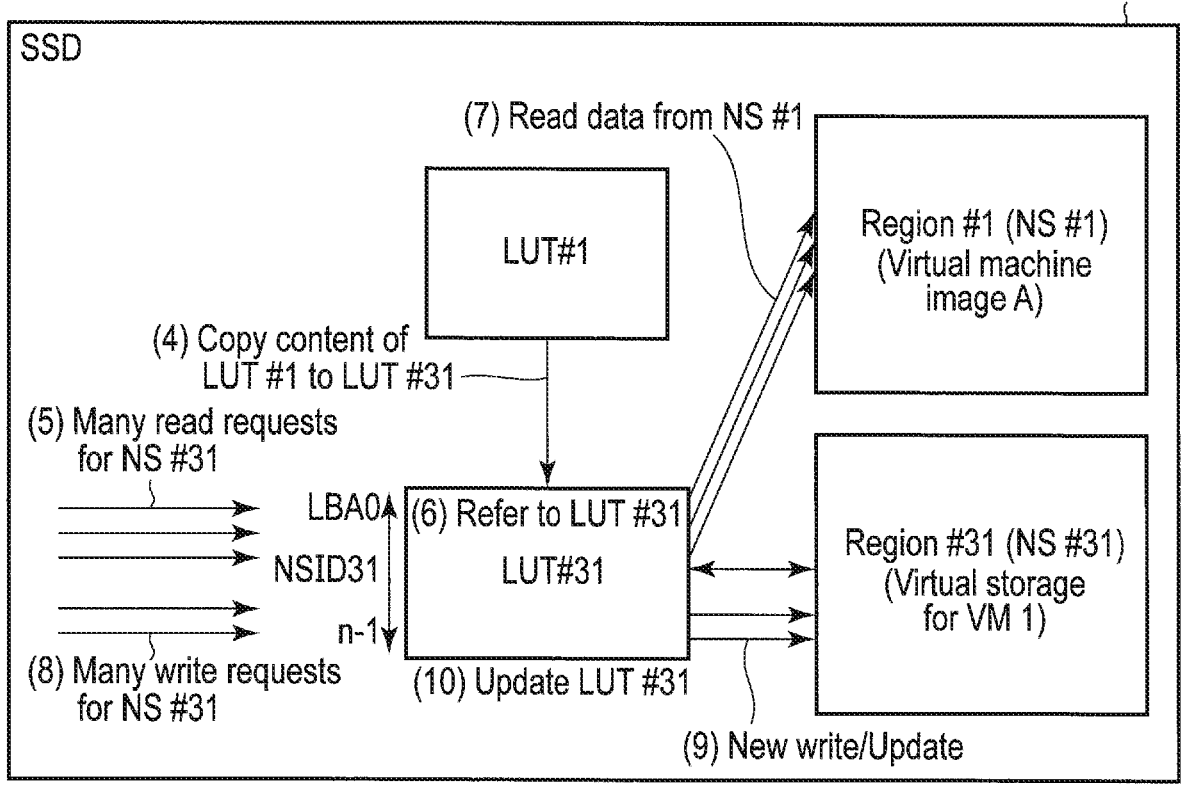
FIG. 6 is illustrated to explain the operation for controlling region #31 in the memory system of the embodiment.

FIG. 6 illustrates the operation for controlling region #31.

(4) The server (host computing device) 100 transmits, to the SSD 3, a copy request (copy command) for copying a logical-to-physical address translation table based on the operation of the administrator of the server 100. The copy request includes a copy source parameter specifying the copy source region (copy source LUT) and a copy destination parameter specifying the copy destination region (copy destination LUT). When a virtual storage for virtual machine VM1 referring to the original data (here, virtual machine image A) should be created in region #31 corresponding to namespace NS #31, the server 100 transmits, to the SSD 3, a copy request (copy command) including a copy source parameter specifying the identifier (NSID 1) of namespace NS #1 and a copy destination parameter specifying the identifier (NSID 31) of namespace NS #31. When the SSD 3 receives the copy command, the SSD 3 copies the content of LUT #1 specified by the copy source parameter (in other words, the assembly of the physical addresses mapped to the logical addresses of region #1, respectively) to LUT #31 specified by the copy destination parameter. When this copying process is completed, virtual machine VM1 becomes available. Normally, the capacity of each LUT is approximately a thousandth of the capacity of a corresponding region. Thus, the time to copy an LUT is approximately a thousandth of the time to copy virtual machine image A. The process for copying an LUT is completed at once. In this way, the use of virtual machine VM1 can be immediately started.

(5) To boot operating system (OS) #1 from the virtual storage for virtual machine VM1, the server 100 (virtual machine VM1 of the host computing device) transmits a large number of read requests (read commands) each specifying an LBA in region #31 to the SSD 3. Each read request includes the identifier (NSID 31) of namespace NS #31, a starting LBA and a transfer length.

(6) When the SSD 3 receives a read request, the SSD 3 refers to LUT #31 corresponding to NSID 31 and obtains a physical address corresponding to the starting LBA included in the read request from LUT #31.

(7) The SSD 3 reads data, using the obtained physical address. As the physical address indicates a physical storage location in region #1, a part of the original data (a part of operating system (OS) #1) is read from region #1, and is returned to the server 100 (virtual machine VM1 of the host computing device). Operating system (OS) #1 is booted by data reading from region #1 performed in response to a large number of read requests. Operating system (OS) #1 is executed as the guest operating system for virtual machine VM1. As a result, virtual machine VM1 transitions to an operating state in which various services can be executed.

When it is necessary to execute an application program on operating system (OS) #1, virtual machine VM1 (OS #1) transmits a large number of read requests (read commands) each specifying an LBA in region #31 to the SSD 3 to execute the application program. Each read request includes the identifier (NSID 31) of namespace NS #31, a starting LBA and a transfer length. When the SSD 3 receives a read request, the SSD 3 refers to LUT #31 corresponding to NSID 31 and obtains a physical address corresponding to the starting LBA from LUT #31. The SSD 3 reads data, using the obtained physical address. As the physical address indicates a physical storage location in region #1, a part of the application program is read from region #1, and is returned to the server 100 (virtual machine VM1 of the host computing device). The application program is executed by data reading from region #1 performed in response to a large number of read requests.

(8) While virtual machine VM1 is in an operating state, the server 100 (virtual machine VM1) transmits a large number of write requests (write commands) each specifying an LBA in region #31 to the SSD 3 to, for example, newly write user data, rewrite the user data or update operating system (OS) #1.

(9) When the SSD 3 receives a write request, the SSD 3 writes the data (write data) received from the server 100 (virtual machine VM1) to region #31.

(10) When the data (write data) is written to region #31, the SSD 3 updates LUT #31 such that the physical address indicating the physical storage location to which the data is written in region #31 is mapped to the LBA of the data. Thus, when a subsequent read request for the data is received, the data is read from region #31 and is returned to the server 100 (virtual machine VM1). The update data of the data is also written to region #31.

FIG. 7 illustrates the operation for controlling region #32.

(4) The server 100 transmits, to the SSD 3, a copy request (copy command) for copying a logical-to-physical address translation table based on the operation of the administrator of the server 100. When a virtual storage for virtual machine VM2 referring to original data (for example, virtual machine image A) should be created in region #32 corresponding to namespace NS #32, the copy request includes a copy source parameter specifying the copy source region (copy source LUT) and a copy destination parameter specifying the copy destination region (copy destination LUT). When the SSD 3 receives the copy command, the SSD 3 copies the content of LUT #1 to LUT #32. When this copying process is completed, virtual machine VM2 becomes available.

(5) To boot operating system (OS) #1 from the virtual storage for virtual machine VM2, the server 100 (virtual machine VM2) transmits a large number of read requests (read commands) each specifying an LBA in region #32 to the SSD 3. Each read request includes the identifier (NSID 32) of namespace NS #32, a starting LBA and a transfer length.

(6) When the SSD 3 receives a read request, the SSD 3 refers to LUT #32 corresponding to NSID 32 and obtains a physical address corresponding to the starting LBA from LUT #32.

(7) The SSD 3 reads data, using the obtained physical address. As the physical address indicates a physical storage location in region #1, a part of operating system (OS) #1 is read from region #1. Operating system (OS) #1 is booted by data reading from region #1 performed in response to a large number of read requests. Operating system (OS) #1 is executed as the guest operating system for virtual machine VM2. As a result, virtual machine VM2 transitions to an operating state in which various services can be executed.

When it is necessary to execute an application program on operating system (OS) #1, virtual machine VM2 (OS #1) transmits a large number of read requests (read commands) each specifying an LBA in region #32 to the SSD 3 to execute the application program. Each read request includes the identifier (NSID 32) of namespace NS #32, a starting LBA and a transfer length. When the SSD 3 receives a read request, the SSD 3 refers to LUT #32 corresponding to NSID 32 and obtains a physical address corresponding to the starting LBA from LUT #32. The SSD 3 reads data, using the obtained physical address. As the physical address indicates a physical storage location in region #1, a part of the application program is read from region #1. The application program is executed by data reading from region #1 performed in response to a large number of read requests.

(8) While virtual machine VM2 is in an operating state, the server 100 (virtual machine VM2) transmits a large number of write requests (write commands) each specifying an LBA in region #32 to the SSD 3 to, for example, newly write user data, rewrite the user data or update operating system (OS) #1.

(9) When the SSD 3 receives a write request, the SSD 3 writes the data (write data) received from the server 100 (virtual machine VM2) to region #32.

(10) When the data (write data) is written to region #32, the SSD 3 updates LUT #32 such that the physical address indicating the physical storage location to which the data is written in region #32 is mapped to the LBA of the data. Thus, when a subsequent read request for the data is received, the data is read from region #32. The update data of the data is also written to region #32.

Figure 8:
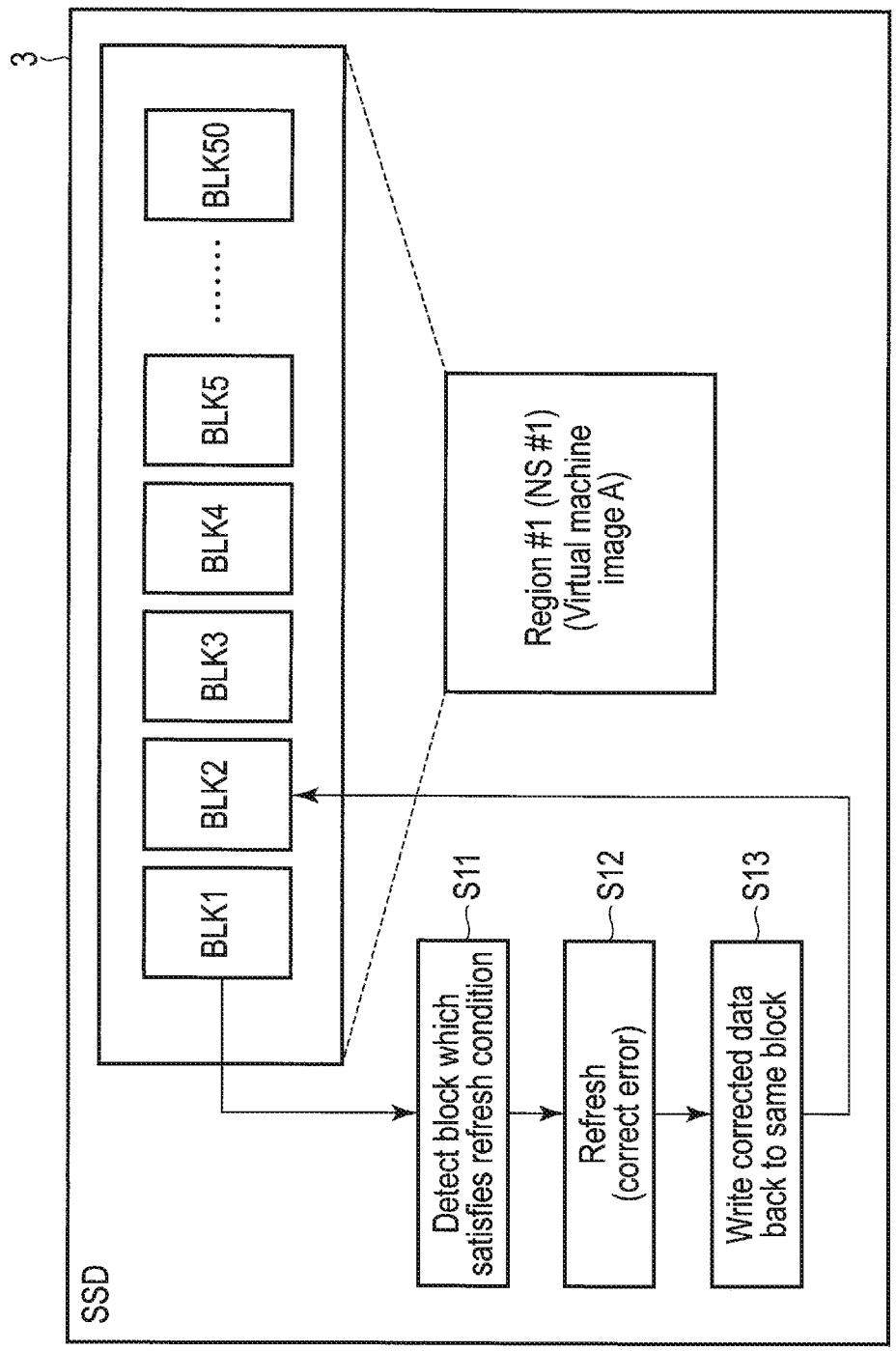
FIG. 8 is illustrated to explain an example of a refresh operation for region #1.

FIG. 8 illustrates an example of a refresh operation for region #1 by the SSD 3.

As described above, the original data of region #1 is referred to by regions #31 and #32. Thus, data is read from region #1 with very high frequency. Although the number of times of rewrites (the number of program/erase cycles) of each of blocks allocated to region #1 is small, the number of times of data reads (read counts) of each of blocks allocated to region #1 is very large. The increase in read counts (the increase in the number of data reads) leads to an increase in the number of read disturb errors. A read disturb error is a phenomenon that the threshold voltage level of a memory cell (in particular, a non-selected memory cell) is changed (increased) by data reading. By this read disturb error, the bit error rate of the data to be read from the blocks allocated to region #1 may be increased.

To solve the above problem, the SSD 3 performs the following refresh operation, taking into consideration the fact that the number of times of rewrites (the number of program/erase cycles) of each of blocks allocated to region #1 is small.

The SSD 3 detects a block which satisfies a refresh condition from the group of blocks allocated to region #1 (step S11). A block which satisfies a refresh condition may be either a block in which the bit error rate is greater than or equal to threshold X or a block in which the total number of reads (read counts) is greater than or equal to threshold Y. The SSD 3 corrects the error of the data in the detected block (step S12). In step S12, the SSD 3 corrects the error of the data, using an error-correcting code (ECC) added to the data in the detected block. The SSD 3 writes the corrected data back to the detected block (step S13). For example, when the bit error rate of block (BLK) 2 allocated to region #1 is greater than or equal to threshold X, BLK 2 may be detected as a block which satisfies the refresh condition, in other words, as a block to which a refresh operation should be applied. The error of all the data portions of BLK 2 is corrected. After the erase operation of BLK 2 is performed, the corrected data portions are written back to BLK 2.

In a conventional refresh operation, the data read from BLK 2 to be refreshed is moved to a block (move destination block) different from BLK 2. LUT #1 is updated such that the physical address of the move destination block is mapped to the logical address of the moved data.

However, in the present embodiment, the content of LUT #1 (a set of physical addresses) is copied to LUT #31 and is further copied to LUT #32. Thus, if data is moved from BLK 2 to another block by a refresh operation, LUT #31 and LUT #32 need to be updated in addition to LUT #1. In this way, the amount of the logical-to-physical address translation data to be updated is greatly increased. This increase may cause the degradation in the performance of the SSD 3.

In the present embodiment, the corrected data portions are written back to BLK 2. Thus, none of LUT #1, LUT #31 and LUT #32 needs to be updated. The number of times of rewrites of each block allocated to region #1 is very small. Thus, even when the corrected data portions are written back to BLK 2, the number of times of rewrites of BLK 2 (in other words, the number of program/erase cycles of BLK 2) does not come close to a limit value. In this way, in the improved refresh operation, corrected data is written back to the original BLK 2. Thus, it is possible to reduce the number of read disturb errors of region #1 (NS #1) and efficiently improve the reliability of each block allocated to region #1 (NS #1).

Figure 9:
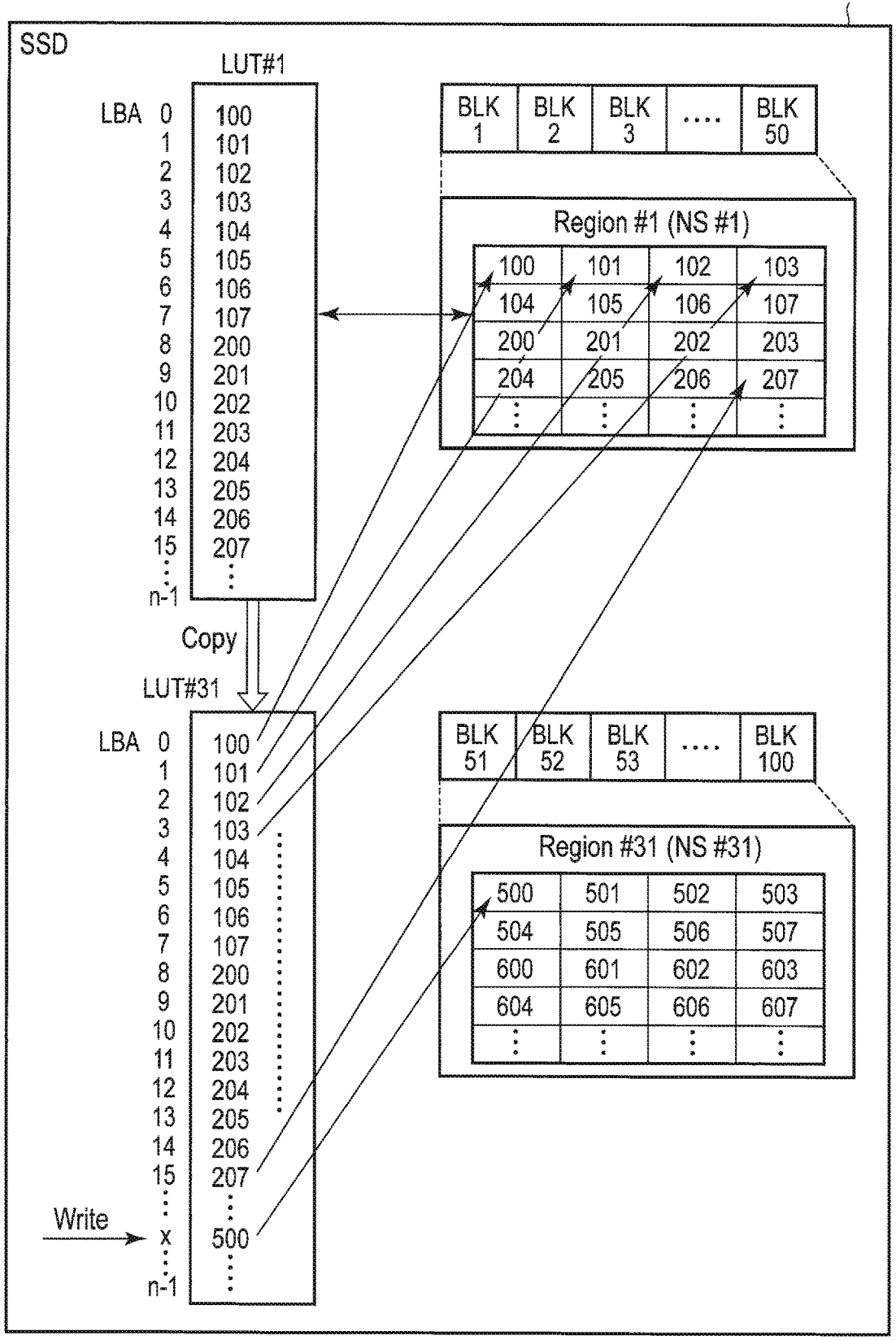
FIG. 9 illustrates an example of content of lookup table #1 corresponding to region #1 and an example of content of lookup table #31 corresponding to region #31.

FIG. 9 illustrates an example of the content of LUT #1 corresponding to region #1 and an example of the content of LUT #31 corresponding to region #31.

BLK 1, BLK 2, BLK 3, . . . , BLK 50 of the nonvolatile memory are allocated to region #1 (NS #1). BLK 51, BLK 52, BLK 53, . . . , BLK 100 of the nonvolatile memory are allocated to region #31 (NS #31). Each of BLK 1, BLK 2, BLK 3, . . . , BLK 50 allocated to region #1 is used only to store virtual machine image A and is not used to store the data for the other regions (the other namespaces). Thus, it is possible to maintain the few rewrites of each of BLK 1, BLK 2, BLK 3, . . . , BLK 50.

LUT #1 includes a plurality of entries respectively corresponding to LBA 0, LBA 1, LBA 2, LBA 3, LBA 4, LBA 5, LBA 6, LBA 7, LBA 8, LBA 9, LBA 10, LBA 11, LBA 12, LBA 13, LBA 14, LBA 15, . . . , corresponding to namespace NS #1. An entry corresponding to each LBA to which data is written holds the physical address indicating the physical storage location to which the data is actually written in the nonvolatile memory. An entry corresponding to each LBA which has not been used for writing data yet does not hold a physical address. Such an entry may hold a null value indicating that the entry is an empty entry which does not hold a physical address.

Similarly, LUT #31 includes a plurality of entries respectively corresponding to LBA 0, LBA 1, LBA 2, LBA 3, LBA 4, LBA 5, LBA 6, LBA 7, LBA 8, LBA 9, LBA 10, LBA 11, LBA 12, LBA 13, LBA 14, LBA 15, . . . , corresponding to namespace NS #31.

FIG. 9 illustrates a case where physical addresses "100", "101", "102", "103", "104", "105", "106", "107", "200", "201", "202", "203", "204", "205", "206", "207", . . . , of region #1 are mapped to LBA 0, LBA 1, LBA 2, LBA 3, LBA 4, LBA 5, LBA 6, LBA 7, LBA 8, LBA 9, LBA 10, LBA 11, LBA 12, LBA 13, LBA 14, LBA 15, . . . , corresponding to namespace NS #1 in LUT #1.

When the content of LUT #1 is copied to LUT #31, physical addresses "100", "101", "102", "103", "104", "105", "106", "107", "200", "201", "202", "203", "204", "205", "206", "207", . . . , of region #1 are stored in entries corresponding to LBA 0, LBA 1, LBA 2, LBA 3, LBA 4, LBA 5, LBA 6, LBA 7, LBA 8, LBA 9, LBA 10, LBA 11, LBA 12, LBA 13, LBA 14, LBA 15, . . . , corresponding to namespace NS #31 in LUT #31. As a result, physical addresses "100", "101", "102", "103", "104", "105", "106", "107", "200", "201", "202", "203", "204", "205", "206", "207", . . . , of region #1 are mapped to LBA 0, LBA 1, LBA 2, LBA 3, LBA 4, LBA 5, LBA 6, LBA 7, LBA 8, LBA 9, LBA 10, LBA 11, LBA 12, LBA 13, LBA 14, LBA 15, . . . , corresponding to namespace NS #31.

Thus, each physical address in lookup table (LUT) #31 indicates a corresponding physical storage location in region #1 instead of a corresponding physical storage location in region #31. In this way, a read access to each logical address of region #31 (in other words, each logical address of namespace NS #31) is redirected to region #1.

When the SSD 3 receives a write request specifying LBA x of region #31 (in other words, a request for newly writing data to LBA x to which data has never been written or a request for rewriting the data already written to LBA x) from the server 100, the SSD 3 writes the data to be written (write data) to region #31. For example, when the physical storage location to which the write data is written in region #31 is the physical storage location specified by the physical address "500", LUT #31 is updated such that the physical address "500" indicating the physical storage location in region #31 is mapped to LBA x.

In this case, when the value of an entry corresponding to LBA x is a null value in LUT #31, in other words, when the received write request is a request for newly writing data to LBA x, the physical address "500" is newly stored in the entry corresponding to LBA x. As a result, the content of the entry corresponding to LBA x is changed from a null value to the physical address "500".

When the physical address indicating a physical storage location in region #1 has been already stored in an entry corresponding to LBA x, in other words, when the received write request is a request for rewriting old data already written to LBA x, the content of the entry corresponding to LBA x is changed from the physical address indicating the physical storage location in which the old data of LBA x is stored to the physical address "500" in LUT #31.

In the present embodiment, this specification explains the environment in which a plurality of namespaces are used. However, the present embodiment is not limited to only the environment in which a plurality of namespaces are used. For example, the present embodiment may be applied to an environment in which an LBA space different from the LBA space of region #1 is allocated to region #31. For example, the LBA space of region #1 may include LBA 0, LBA 1, LBA 2, LBA 3, LBA 4, LBA 5, LBA 6, LBA 7, LBA 8, LBA 9, LBA 10, LBA 11, LBA 12, LBA 13, LBA 14, LBA 15, ..., LBA n−1. The LBA space of region #31 may include LBA n, LBA n+1, LBA n+2, LBA n+3, LBA n+4, LBA n+5, LBA n+6, LBA n+7, LBA n+8, LBA n+9, LBA n+10, LBA n+11, LBA n+12, LBA n+13, LBA n+14, LBA n+15, ..., LBA 2n−1.

In this case, when the content of LUT #1 is copied to LUT #31, the physical addresses "100", "101", "102", "103", "104", "105", "106", "107", "200", "201", "202", "203", "204", "205", "206", "207", ..., of region #1 are mapped to LBA n, LBA n+1, LBA n+2, LBA n+3, LBA n+4, LBA n+5, LBA n+6, LBA n+7, LBA n+8, LBA n+9, LBA n+10, LBA n+11, LBA n+12, LBA n+13, LBA n+14, LBA n+15, ..., corresponding to region #31. In this case, a read request specifying an LBA in region #31 can be redirected to region #1.

Since a process for rewriting the data of region #1 (namespace #1) is hardly performed, thin provisioning may be applied to region #1 (namespace #1). In this case, in region #1 (namespace #1), only a group of blocks in number equivalent to a capacity less than the size of region #1 (in other words, less than a capacity corresponding to the number of LBAs of region #1) is secured (reserved). Similarly, thin provisioning may be applied to region #2 (namespace #2).

Either thin provisioning or over-provisioning may be applied to region #31 (namespace #31). Similarly, either thin provisioning or over-provisioning may be applied to region #32 (namespace #32) and region #33 (namespace #33).

FIG. 10 illustrates a read operation performed in response to a read request specifying a logical address in region #31 (or region #32) and a write operation performed in response to a write request specifying a logical address in region #31 (or region #32).

In the present embodiment, the content of LUT #1 is copied to each of LUT #31 and LUT #32. As a result, a read access to each LBA of region #31 is redirected to region #1. Similarly, a read access to each LBA of region #32 is redirected to region #1.

When the SSD 3 receives a write request specifying an LBA (for example, LBA x) in region #31 from the server 100, the SSD 3 writes data DATAx received from the server 100 to an available physical storage location in region #31. LUT #31 is updated such that the physical address indicating the physical storage location to which data DATAx is written is stored in an entry corresponding to LBA x in LUT #31.

When the SSD 3 receives a write request specifying an LBA (for example, LBA y) in region #31 from the server 100, the SSD 3 writes data DATAy received from the server 100 to an available physical storage location in region #31. LUT #31 is updated such that the physical address indicating the physical storage location to which data DATAy is written is stored in an entry corresponding to LBA y in LUT #31.

When the SSD 3 receives a write request specifying an LBA (for example, LBA z) in region #32 from the server 100, the SSD 3 writes data DATAz received from the server 100 to an available physical storage location in region #32. LUT #32 is updated such that the physical address indicating the physical storage location to which data DATAz is written is stored in an entry corresponding to LBA z in LUT #32.

Figure 11:
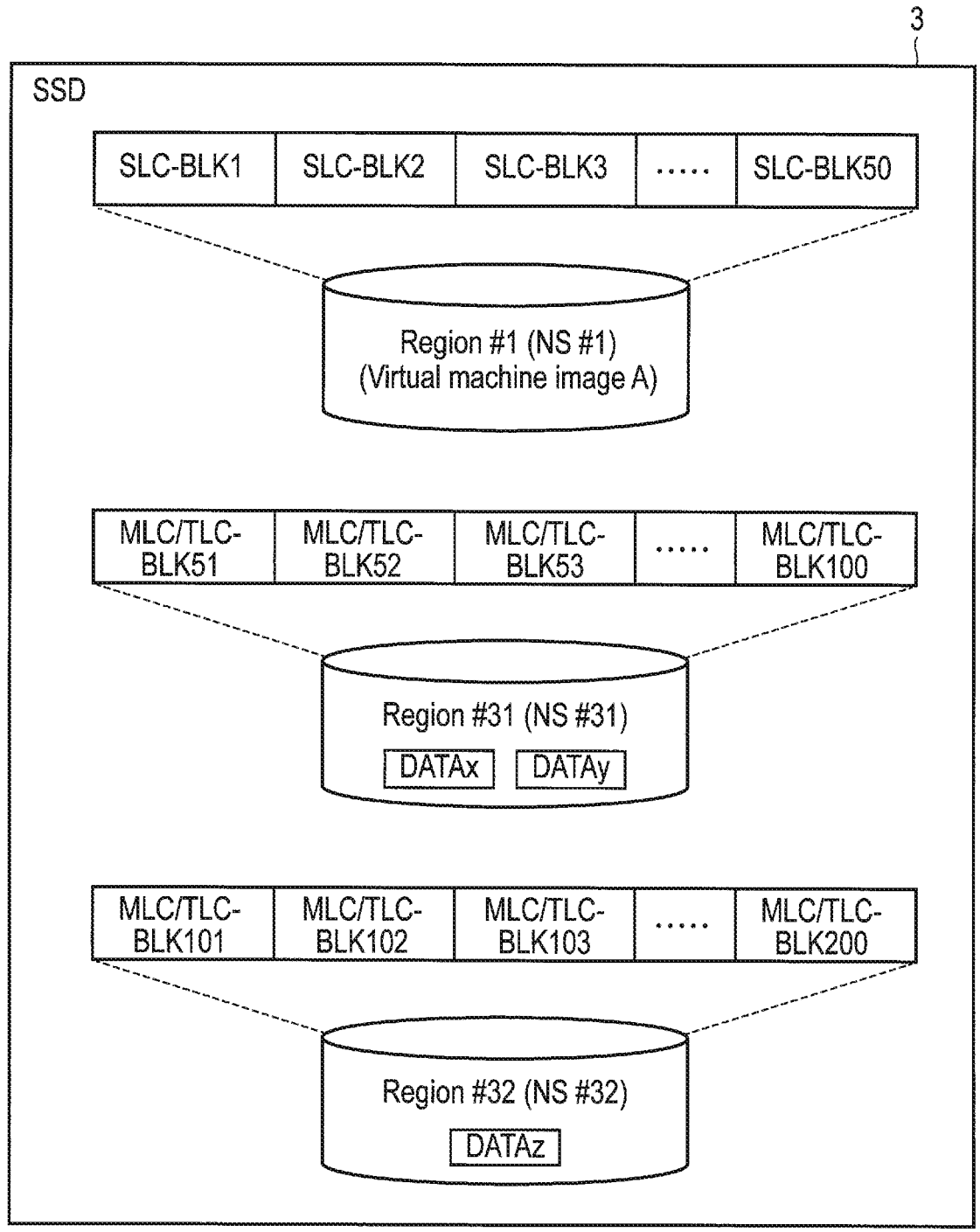
FIG. 11 illustrates the group of SLC blocks allocated to region #1 and the group of MLC/TLC blocks allocated to region #31 (or region #32).

FIG. 11 illustrates the group of single-level-cell (SLC) blocks allocated to region #1 and the group of multi-level-cell (MLC)/triple-level-cell (TLC) blocks allocated to region #31 (or region #32).

In SLC blocks, each memory cell stores data of 1 bit. Each memory cell is set to one of two threshold voltage distributions corresponding to two states (specifically, an erase state and a program state). Thus, in SLC blocks, the amount of margin to separate these states (an erase state and a program state) from each other is relatively large. Thus, a read disturb error is difficult to occur.

In MLC blocks, each memory cell stores data of 2 bits. Each memory cell is set to one of four threshold voltage distributions corresponding to four states (specifically, an erase state and three program states). In MLC blocks, these four states are arranged at relatively narrow threshold voltage intervals. Thus, the amount of margin to separate two adjacent states from each other is smaller than that of SLC blocks. A read disturb error is generated more easily than SLC blocks.

In TLC blocks, each memory cell stores data of 3 bits. Each memory cell is set to one of eight threshold voltage distributions corresponding to eight states (specifically, an erase state and seven program states). Thus, in TLC blocks, the amount of margin to separate two adjacent states from each other is smaller than MLC blocks. A read disturb error is generated more easily than MLC blocks.

In the present embodiment, as shown in FIG. 11, a group of SLC blocks (SLC-BLK 1, SLC-BLK 2, SLC-BLK 3, ..., SLC-BLK 50) is allocated as physical resources to region #1 (NS #1) in which data reading is frequently performed and data rewriting is hardly performed. In region #1, the resistance to read disturb errors is more important than the capacity cost.

In region #31 (NS #31), the number of data reads is less than that of region #1 (NS #1). However, a large amount of data may be written to region #31 as time passes. Thus, a group of MLC (or TLC) blocks (MLC/TLC-BLK 51, MLC/TLC-BLK 52, MLC/TLC-BLK 53, ..., MLC/TLC-BLK 100) is allocated as physical resources to region #31 (NS #31). In region #31, the capacity cost is more important than the resistance to read disturb errors.

Similarly, a group of MLC (or TLC) blocks (MLC/TLC-BLK 101, MLC/TLC-BLK 102, MLC/TLC-BLK 103, ..., MLC/TLC-BLK 200) is allocated as physical resources to region #32 (NS #32).

When the SSD 3 comprises a built-in SLC-NAND flash memory in which each memory cell is capable of storing data of 1 bit and a built-in MLC/TLC-NAND flash memory in which each memory cell is capable of storing data of a plurality of bits, a group of SLC blocks in the SLC-NAND flash memory may be allocated to region #1, and groups of MLC/TLC blocks in the MLC/TLC-NAND flash memory may be allocated to regions #31 and #32.

When the SSD 3 comprises a built-in MLC/TLC-NAND flash memory in which each memory cell is capable of storing data of a plurality of bits, each MLC/TLC block allocated to region #1 from the MLC/TLC-NAND flash memory may be set to an SLC mode, and each MLC/TLC block allocated to region #31 (or region #32) from the MLC/TLC-NAND flash memory may be set to an MLC/TLC mode.

Regarding the MLC/TLC blocks set to an SLC mode, the SSD 3 writes data (here, the binary image of an operating system, etc.) to the MLC/TLC blocks in a first write mode for writing data of 1 bit per memory cell. In other words, the SSD 3 writes data to region #1, using the first write mode for writing data of 1 bit per memory cell. For example, in the first write mode, only lower page data may be written to the group of memory cells connected to the same word line.

Regarding the MLC/TLC blocks set to an MLC/TLC mode, the SSD 3 writes data to the MLC/TLC blocks in a second write mode for writing data of a plurality of bits per memory cell. In other words, the SSD 3 writes data to region #31 or region #32, using the second write mode for writing data of a plurality of bits per memory cell. For example, in the second write mode, lower page data and upper page data may be written to the group of memory cells connected to the same word line (MLC mode). Further, lower page data, middle page data and upper page data may be written to the group of memory cells connected to the same word line (TLC mode).

Figure 12:
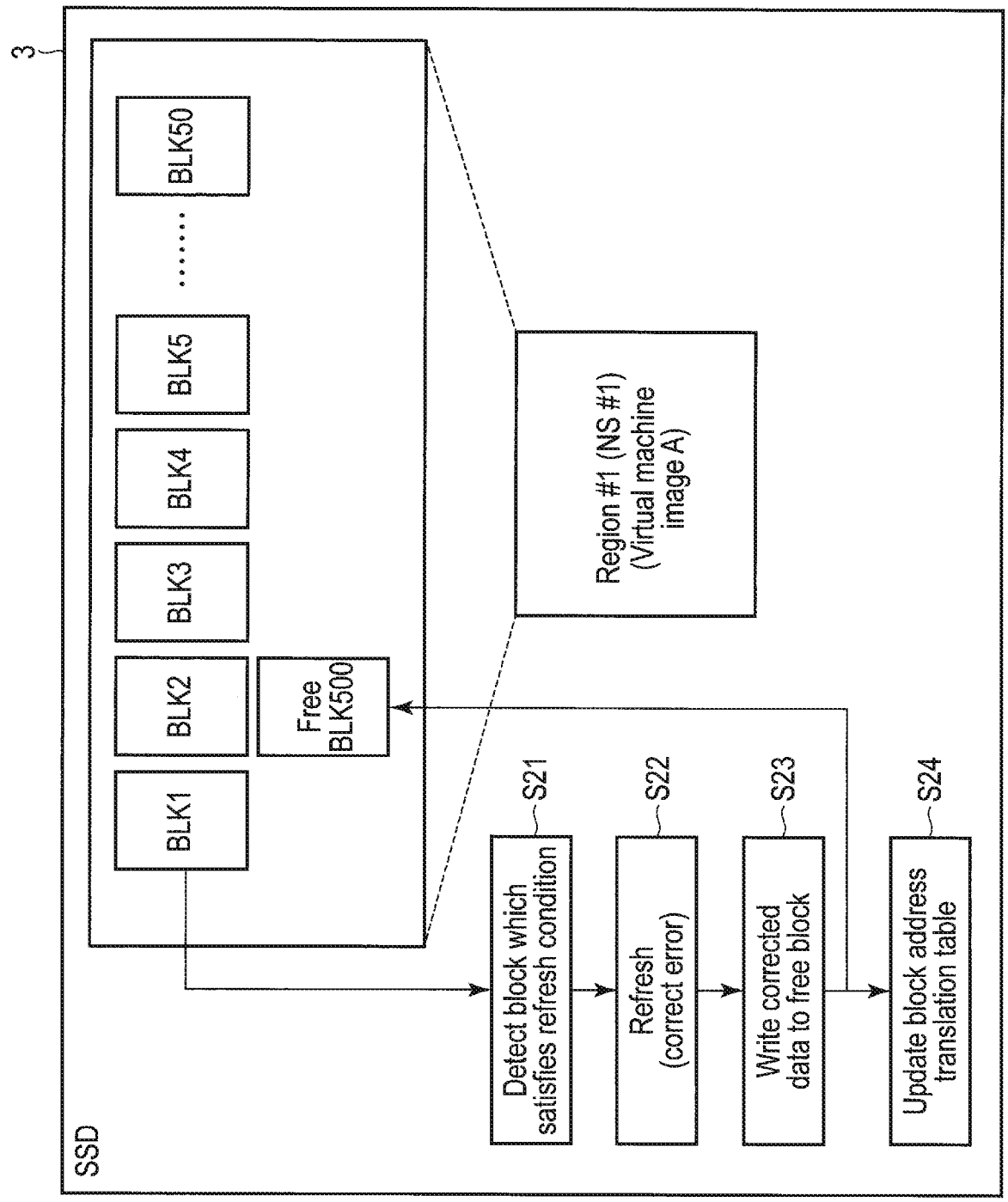
FIG. 12 is illustrated to explain another example of a refresh operation for region #1.

FIG. 12 illustrates another example of a refresh operation for region #1.

Figure 13:
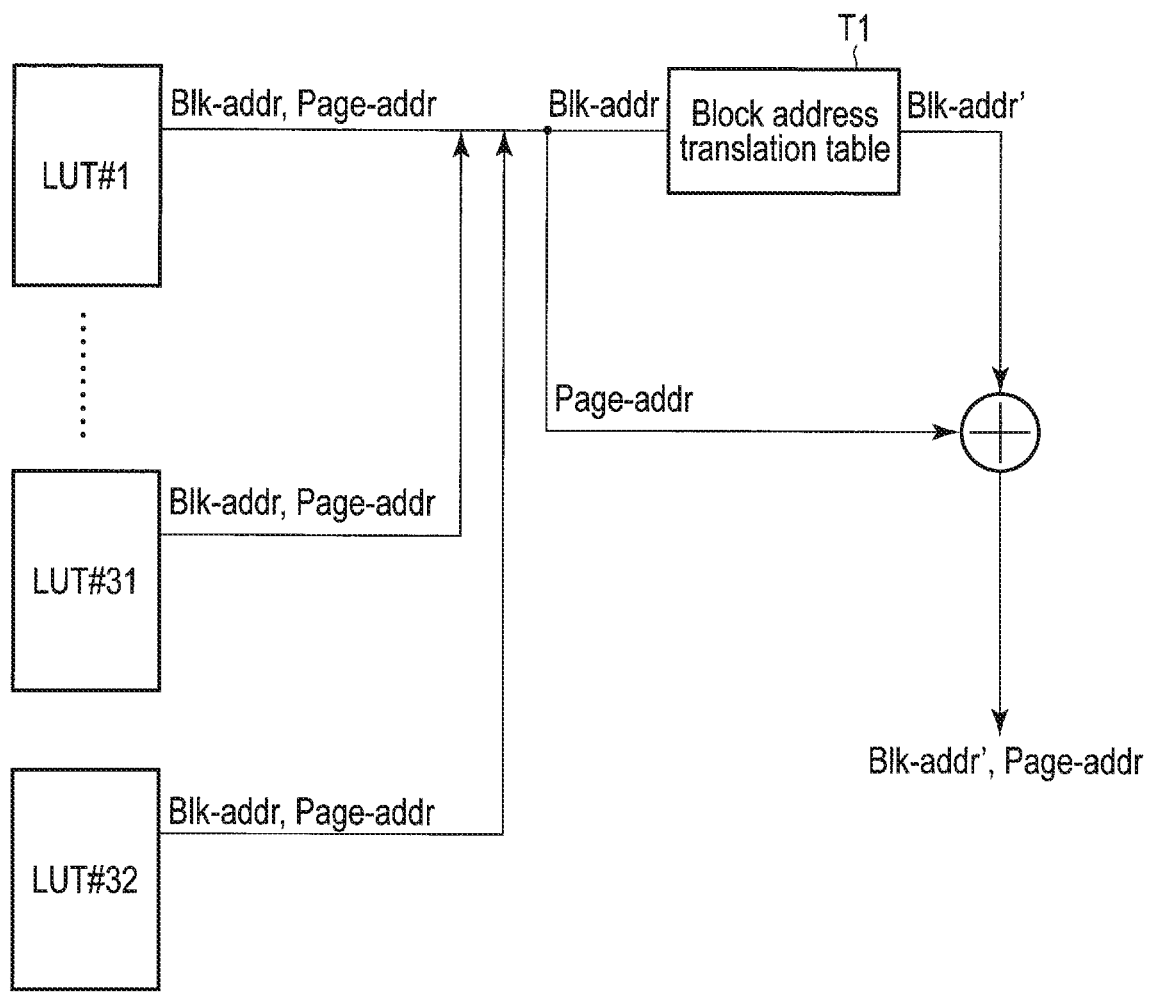
FIG. 13 is illustrated to explain a block address translation table shared by a lookup table corresponding to region #1 and a lookup table corresponding to region #31 (or a lookup table corresponding to region #32).

The refresh operation of FIG. 12 is applied to a configuration in which address translation is performed in two stages as shown in FIG. 13.

Address translation in two stages is explained below.

As shown in FIG. 13, a block address translation table T1 is provided after each of LUT #1, . . . , LUT #31 and LUT #32. The block address translation table T1 manages the mapping between block addresses before translation and block addresses after translation. The block address translation table T1 may include, for example, a plurality of entries corresponding to a plurality of block addresses before translation. Each entry stores a block address after translation corresponding to a corresponding block address before translation.

Each physical address obtained from LUT #1, LUT #31 or LUT #32 includes block address BLK-addr and page address Page-addr. In accordance with block address BLK-addr included in the obtained physical address, an entry is selected from the entries of the block address translation table T1. Block address BLK-addr' held in the selected entry is read from the block address translation table T1. A new physical address (including block address BLK-addr' and page address Page-addr) is generated by block address BLK-addr' and page address Page-addr included in the obtained physical address.

In the above address translation in two stages, even if the data of a block allocated to region #1 is moved to another block (move destination block), a physical address corresponding to the move destination block can be obtained by updating only the block address translation table T1 without updating LUT #1, LUT #31 or LUT #32.

In the refresh operation of FIG. 12, the following process is performed.

The SSD 3 detects a block which satisfies a refresh condition from the group of blocks allocated to region #1 (step S21). A block which satisfies a refresh condition may be either a block in which the bit error rate is greater than or equal to threshold X or a block in which the total number of reads (read counts) is greater than or equal to threshold Y. The SSD 3 corrects the error of the data of the detected block (step S22). In step S22, the SSD 3 corrects the error of the data, using an error-correcting code (ECC) added to the data of the detected block. The SSD 3 writes the corrected data to a block (move destination block) different from the detected block (step S23). The move destination block may be a free block in which the total number of reads is small. The SSD 3 updates the block address translation table T1 such that an access to the detected block is redirected to the move destination block (step S24). In step S24, the SSD 3 stores the block address of the move destination block in the block address translation table T1 such that the block address of the detected block included in the physical address obtained from LUT #1, LUT #31 or LUT #32 is translated into the block address of the move destination block. In this case, the block address of the move destination block is stored in an entry corresponding to the block address of the detected block.

FIG. 14 illustrates an information processing system 1 including the SSD 3 and the server (host computing device) 100.

The server (host computing device) 100 may be connected to a plurality of terminals 51 via a network 50. The terminals 51 corresponding to user A, user B and user C explained in FIG. 1 and FIG. 2. The server 100 provides the terminals 51 with service such as IaaS.

The SSD 3 may be used as the physical storage of the server 100. The SSD 3 may be housed in a computing device functioning as the server 100 or may be connected to the computing device via a cable or a network.

As the interface for mutually connecting the server 100 and the SSD 3, for example, SCSI, Serial Attached SCSI (SAS), ATA, Serial ATA (SATA), PCI Express (PCIe), Ethernet (registered trademark), Fibre channel or NVM Express (NVMe) (registered trademark) may be used.

The SSD 3 comprises a controller (memory controller) 4 and a nonvolatile memory (NAND flash memory) 5. The SSD 3 may further comprise a random access memory, for example, a DRAM 6.

The NAND flash memory 5 includes a memory cell array including a plurality of memory cells arrayed in matrix. The NAND flash memory 5 may be either a NAND flash memory comprising a two-dimensional structure or a NAND flash memory comprising a three-dimensional structure.

The memory cell array of the NAND flash memory 5 includes a plurality of blocks (BLKs) 0 to m-1. Each of BLK 0 to BLK m-1 includes a large number of pages (here, P 0 to P n-1). BLK 0 to BLK m-1 function as erase units. Blocks may be called erase blocks or physical blocks. Each of P 0 to P n-1 includes a plurality of memory cells connected to the same word line. P 0 to P n-1 are the units of the operation for writing data and the operation for reading data.

The controller 4 is electrically connected to the NAND flash memory 5 which is a nonvolatile memory via a NAND interface 13 such as Toggle or Open NAND Flash Interface (ONFI). The NAND interface 13 functions as a NAND control circuit configured to control the NAND flash memory 5.

Figure 15:
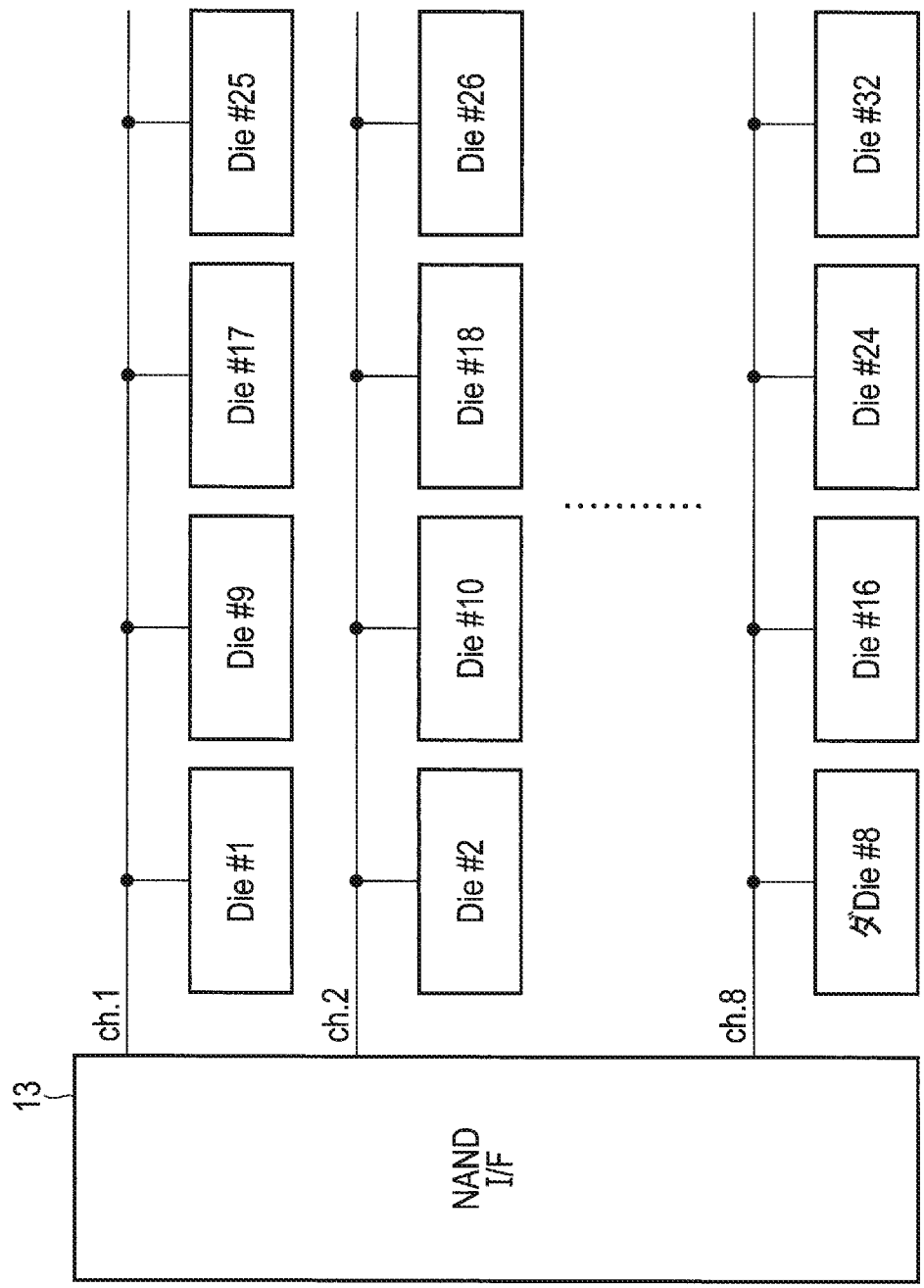
FIG. 15 illustrates the relationships between a NAND interface and a plurality of NAND flash memory dies in the memory system of the embodiment.

As shown in FIG. 15, the NAND flash memory 5 may include a plurality of NAND flash memory dies. Each NAND flash memory die is independently operable. Thus, each NAND flash memory die functions as the smallest unit operable in parallel. FIG. 15 illustrates a case where eight channels Ch. 1 to Ch. 8 are connected to the NAND interface 13, and four NAND flash memory dies are connected to each of the eight channels Ch. 1 to Ch. 8. In this case, up to thirty two NAND flash memory dies #1, #2, . . . , #32 may be operated in parallel.

The controller 4 of the SSD 3 may function as a flash translation layer (FTL) configured to manage the data of the NAND flash memory 5 and manage the blocks of the NAND flash memory 5.

The data management performed by the FTL includes, for example, (1) the management of mapping data indicating the correspondence relationships between logical addresses and the physical addresses of the NAND flash memory 5 and (2) a process for hiding the read/write in page units and the erase operation in block units.

The management of mapping between logical block addresses (LBAs) and physical addresses is performed by using a lookup table (LUT) which functions as an address translation table (logical-to-physical address translation table).

In the present embodiment, as described above, the controller 4 manages the mapping between LBAs and physical addresses for each region (namespace), using a plurality of lookup tables (LUTs) #1, #2, . . . , #31, #32 and #33 corresponding to a plurality of regions.

A physical address corresponding to an LBA indicates the physical storage location to which the data of the LBA is written in the NAND flash memory 5. LUT #1, LUT #2, . . . , LUT #31, LUT #32 and LUT #33 may be loaded from the NAND flash memory 5 into the DRAM 6 when the SSD 3 is turned on. In general, each LUT is relatively large. Thus, at least a part of each LUT may be stored in the DRAM 6 as a logical-to-physical translation table cache.

When a cache line including the target physical address corresponding to the logical address specified by a read request (read command) from the server 100 is present in the logical-to-physical translation table cache (in other words, in the case of a cache hit), data is immediately read from the physical storage location specified by the target physical address in the NAND flash memory 5.

When a cache line including the target physical address is not present in the logical-to-physical address translation table cache (in other words, in the case of a cache miss), a part (the address translation table portion) of the lookup table including the target physical address is read from the NAND flash memory 5. The content of the cache line to be replaced in the logical-to-physical address translation table cache is removed from the logical-to-physical address translation table cache. In place of the removed content, the address translation table portion read from the NAND flash memory 5 is stored in the cache line. Data is read from the physical storage location specified by the target physical address in the NAND flash memory 5.

In each region of the NAND flash memory 5, data can be written to pages only once per erase cycle. Thus, the controller 4 writes update data corresponding to an LBA to a physical storage location different from the physical storage location in which previous data corresponding to the LBA is stored. The controller 4 updates a lookup table (LUT) corresponding to the region, associates the physical address of the physical storage location to which the update data is written with the LBA, and invalidates the previous data.

The block management includes, for example, the management of bad blocks, wear leveling and garbage collection.

Wear leveling is the operation for leveling the wear of physical blocks.

In garbage collection, to increase the number of free blocks to which data can be written, the controller 4 copies the valid data of some target blocks including both valid data and invalid data to other blocks (for example, free blocks). Here, valid data indicates data which is referred to by LUTs (in other words, data which is associated as the latest data from logical addresses) and which will be read from the server (host computing device) 100. Invalid data indicates data which is no longer read from the server (host computing device) 100. For example, data associated with a logical address is valid data. Data which is not associated with any logical address is invalid data. The controller 4 maps the logical addresses of the copied valid data to the respective copy destination physical addresses. Each block including only invalid data as valid data has been copied to another block is released as a free block. In this way, these blocks become available again after an erase operation is applied to the blocks.

The configuration of the controller 4 is explained below.

For example, the controller 4 may be realized by a single LSI. The controller 4 includes at least hardware logic. The hardware logic includes a host interface 11, a CPU 12, the NAND interface 13, a DRAM interface 14, an ECC circuit 15, etc. The CPU 12, the NAND interface 13, the DRAM interface 14 and the ECC circuit 15 are mutually connected via a bus 10.

The host interface 11 is a host interface circuit configured to perform communication with the server (host computing device) 100. The host interface 11 receives various commands (a write command, a read command, a namespace creation command, a copy command, etc.) from the server (host computing device) 100.

Each write command requests the SSD 3 to write the data specified by the write command. Each write command may include a starting LBA, a transfer length and a namespace ID. The namespace ID of each write command is the identifier for uniquely identifying the region (namespace) to which data should be written. Each read command requests the SSD 3 to read the data specified by the read command. Each read command may include a starting LBA, a transfer length and a namespace ID. The namespace ID of each read command is the identifier for uniquely identifying the region (namespace) from which data should be read.

Each namespace creation command is a command which requests the SSD 3 to create a namespace. Each copy command requests the SSD 3 to copy the content of a namespace to another namespace. More specifically, each copy command requests the SSD 3 to copy the content of the LUT of a namespace to the LUT of another namespace.

The CPU 12 is a processor configured to control the host interface 11, the NAND interface 13, the DRAM interface 14 and the ECC circuit 15. The CPU 12 performs a command process for processing various commands from the server (host computing device) 100, etc., as well as the above process of the FTL.

The FTL process and the command process may be controlled by firmware executed by the CPU 12. The firmware causes the CPU 12 to function as a namespace management unit 21, an LUT copy control unit 22, a write inhibit control unit 23, a read/write control unit 24 and a refresh control unit 25. The namespace management unit 21, the LUT copy control unit 22, the write inhibit control unit 23, the read/write control unit 24 and the refresh control unit 25 may be realized by hardware.

The namespace management unit 21 has a multi-namespace management function for managing a plurality of namespaces. Each namespace is equivalent to a type of region in the NAND flash memory 5 which is a nonvolatile memory. The namespace management unit 21 creates a plurality of namespaces, in other words, a plurality of regions, based on the respective namespace creation commands from the server (host computing device) 100. In other words, the namespace management unit 21 logically divides the NAND flash memory 5 into a plurality of regions (namespaces) based on the respective namespace creation commands from the server (host computing device) 100.

The LUT copy control unit 22 copies the content of a LUT corresponding to the copy source namespace to an LUT corresponding to the copy destination namespace based on an LUT copy command from the server (host computing device) 100. The LUT copy command is a copy command for copying the data stored in the copy source namespace to the copy destination namespace.

The write inhibit control unit 23 sets region #1 (NS #1) to a read-only mode (write inhibit mode) for inhibiting a process for writing data to region #1 (NS #1) after virtual machine image A is written to region #1 (NS #1). Similarly, the write inhibit control unit 23 sets region #2 (NS #2) to a read-only mode (write inhibit mode) for inhibiting a process for writing data to region #2 (NS #2) after virtual machine image B is written to region #2 (NS #2).

When the read/write control unit 24 receives a read command for region #31 (NS #31) from the server (host computing device) 100, the read/write control unit 24 obtains a physical address corresponding to the logical address which is the read target from LUT #31 with reference to LUT #31 corresponding to namespace NS #31. The read/write control unit 24 reads data from the physical storage location specified by the obtained physical address in the NAND flash memory 5 and returns the read data to the server (host computing device) 100. Region #31 (NS #31) functions as the virtual storage (virtual disk) of virtual machine VM1. Virtual machine VM1 is capable of read-accessing region #31 as the virtual storage of virtual machine VM1 by merely issuing a read request (read command) including NSID 31 of namespace NS #31 via a device driver, etc.

When the read/write control unit 24 receives a write command for region #31 (NS #31) from the server (host computing device) 100, the read/write control unit 24 writes the data to be written to region #31 (NS #31), updates LUT #31 and maps the physical address indicating the physical storage location to which the data is written in region #31 to the logical address of the data. Virtual machine VM1 is capable of write-accessing region #31 as the virtual storage of virtual machine VM1 by merely issuing a write request (write command) including NSID 31 of namespace NS #31 via the device driver, etc.

When the read/write control unit 24 receives a read command for region #32 (namespace NS #32) from the server (host computing device) 100, the read/write control unit 24 obtains a physical address corresponding to the logical address which is the read target from LUT #32 with reference to LUT #32 corresponding to namespace NS #32. The read/write control unit 24 reads data from the physical storage location specified by the obtained physical address in the NAND flash memory 5 and returns the read data to the server (host computing device) 100. Region #32 (NS #32) functions as the virtual storage (virtual disk) of virtual machine VM2. Virtual machine VM2 is capable of read-accessing region #32 as the virtual storage of virtual machine VM2 by merely issuing a read request (read command) including NSID 32 of namespace NS #32 via a device driver, etc.

When the read/write control unit 24 receives a write command for region #32 (NS #32) from the server (host computing device) 100, the read/write control unit 24 writes the data to be written to region #32 (NS #32), updates LUT #32 and maps the physical address indicating the physical storage location to which the data is written in region #32 to the logical address of the data. Virtual machine VM2 is capable of write-accessing region #32 as the virtual storage of virtual machine VM2 by merely issuing a write request (write command) including NSID 32 of namespace NS #32 via the device driver, etc.

The refresh control unit 25 detects a block which satisfies a refresh condition from the group of blocks allocated to region #31 (NS #31). The refresh control unit 25 corrects the error of the data of the detected block and writes the corrected data back to the detected block.

As explained in FIG. 12 and FIG. 13, the refresh control unit 25 may write the corrected data to a block (move destination block) different from the detected block. In this case, the refresh control unit 25 stores the block address of the move destination block in the block address translation table T1 such that the block address specifying the detected block is translated into the block address of the move destination block.

The NAND interface 13 controls the NAND flash memory 5 under the control of the CPU 12. The DRAM interface 14 is a DRAM controller configured to control the DRAM 6 under the control of the CPU 12. A part of the storage region of the DRAM 6 is used to store a write buffer (WB) 31 which temporarily stores the write data transmitted from the server (host computing device) 100. Another part of the storage region of the DRAM 6 is used to store LUT #1, LUT #2, . . . , LUT #31, LUT #32 and LUT #33.

The ECC circuit 15 includes an ECC encoder and an ECC decoder. The ECC encoder encodes the data (user data) to be written and generates memory write data including user data and an error-correcting code (ECC). The ECC decoder decodes memory read data including user data and an error-correcting code (ECC) and corrects the error of user data.

Figure 16:
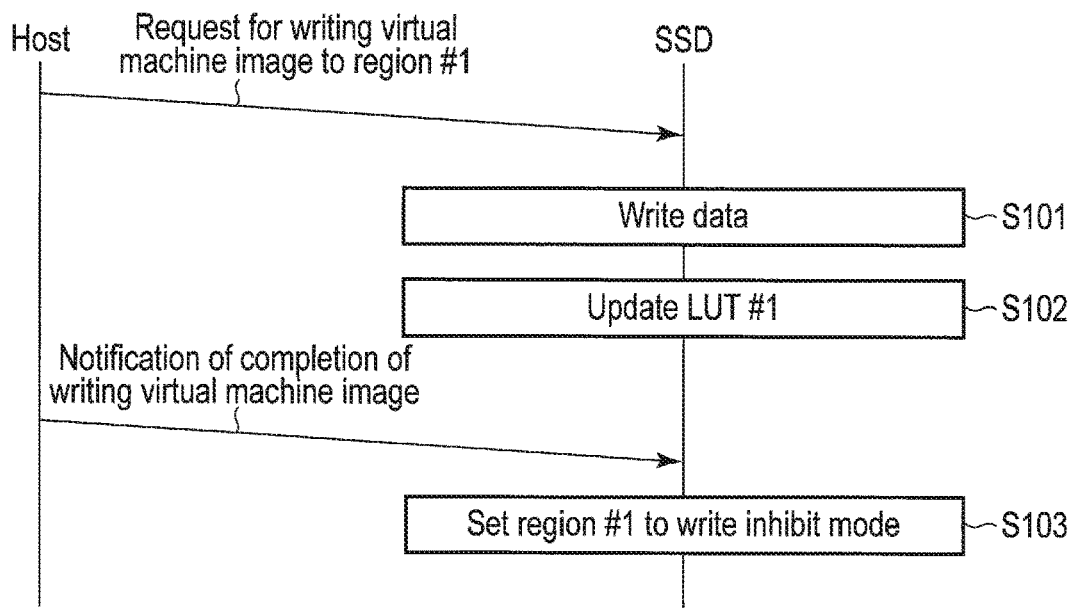
FIG. 16 is a sequence chart illustrating the procedure of a process performed by the memory system of the embodiment for writing a virtual machine image to region #1.

FIG. 16 illustrates the procedure of a process for writing a virtual machine image to region #1.

The server (host computing device) 100 transmits a write request for writing virtual machine image A to region #1 (NS #1) to the SSD 3. The controller 4 of the SSD 3 writes virtual machine image A to region #1 (NS #1) (step S101). The controller 4 updates LUT #1 and maps the physical addresses indicating the physical storage locations to which virtual machine image A is written in region #1 to a plurality of LBAs corresponding to virtual machine image A (step S102).

After all the virtual machine image A is written to region #1, the server (host computing device) 100 may notify the SSD 3 of the completion of the process for writing virtual machine image A based on the operation of the administrator of the server (host computing device) 100. In response to this notification, the controller 4 sets region #1 (NS #1) to a write inhibit mode (a read-only mode for inhibiting writing and permitting only reading) (step S103). In step S103, the controller 4 may inhibit the execution of garbage collection for region #1 (NS #1) in addition to the setup of region #1 (NS #1) to a read-only mode.

Figure 17:
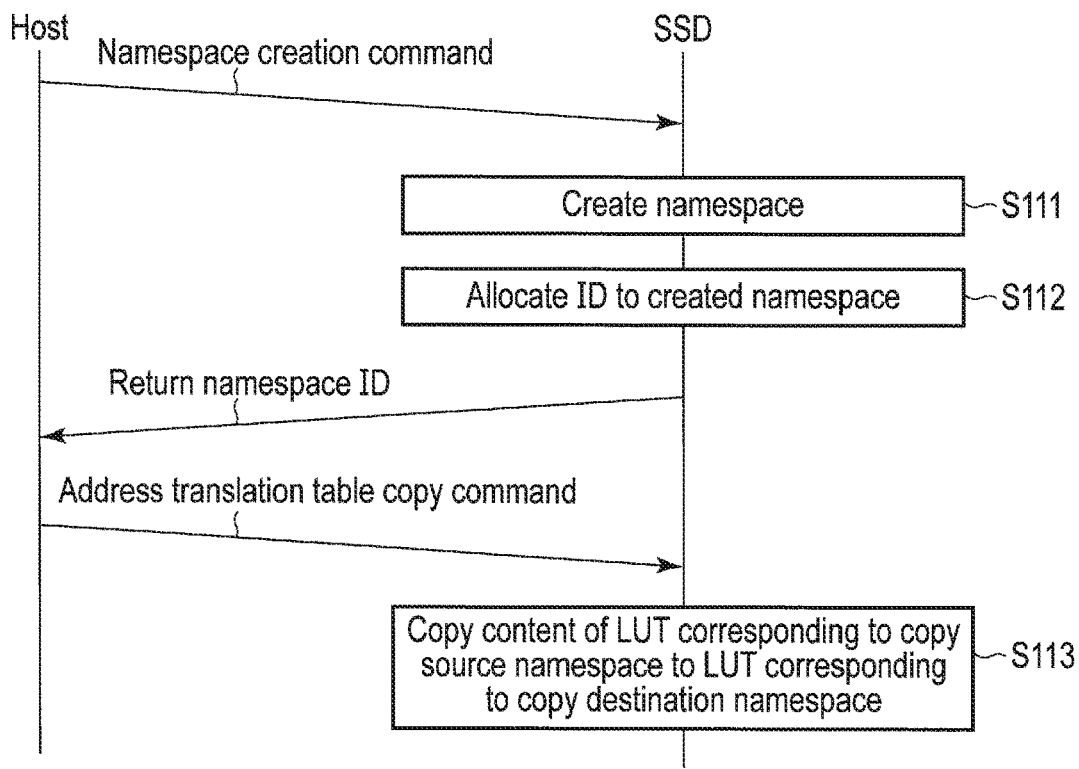
FIG. 17 is a sequence chart illustrating the procedure of a process performed by the memory system of the embodiment for creating virtual storage (region #31 or region #32) for a virtual machine.

FIG. 17 illustrates the procedure of a process for creating virtual storage (region #31 or region #32).

When new virtual storage needs to be created, the server (host computing device) 100 transmits a namespace creation command to the SSD 3 to create virtual storage. The controller 4 of the SSD 3 creates a namespace and reserves some blocks for the namespace (step S111). The controller 4 allocates an ID (NSID) to the created namespace and returns the ID (NSID) of the namespace to the server (host computing device) 100 (step S112).

The server (host computing device) 100 transmits a copy command (address translation table copy command) to the SSD 3. The controller 4 of the SSD 3 copies the content of an LUT corresponding to the NSID specified by the copy source parameter included in the copy command to an LUT corresponding to the NSID specified by the copy destination parameter included in the copy command (step S113).

The flowchart of FIG. 18 illustrates the procedure of a read/write process.

When the controller 4 of the SSD 3 receives a read request (read command) from the server (host computing device) 100 (YES in step S121), the controller 4 refers to an LUT corresponding to the namespace specified by the NSID included in the read command and obtains a physical address corresponding to the logical address (LBA) included in the read command from the LUT (step S122). In other words, when the controller 4 receives a read command specifying a logical address in a region, the controller 4 refers to an LUT corresponding to the region and obtains a physical address corresponding to the logical address included in the read command.

The controller 4 reads data from a physical storage location corresponding to the obtained physical address in the NAND flash memory 5 and returns the read data to the server (host computing device) 100 (step S123). In the present embodiment, for example, the content of LUT #1 of region #1 is copied to LUT #31 corresponding to region #31 for virtual storage. Thus, when a read command specifying a logical address in region #31 is received, LUT #31 is referred to, and further, the physical address indicating the physical storage location in region #1 is obtained from LUT #31. As a result, data is read from the physical storage location in region #1.

When the controller 4 of the SSD 3 receives a write request (write command) from the server (host computing device) 100 (YES in step S124), the controller 4 determines whether or not the write destination namespace specified by the NSID included in the write command is in a write inhibit mode (read-only mode) (step S125). In other words, when the controller 4 receives a write command specifying a logical address in a region, the controller 4 determines whether or not the region is in a write inhibit mode (read-only mode).

When the write destination namespace is set to a write inhibit mode (read-only mode) (YES in step S124), the controller 4 returns an error notification indicating that data writing to the write destination namespace is inhibited to the server (host computing device) 100 (step S128).

When the write destination namespace is not in a write inhibit mode (read-only mode) (NO in step S124), the controller 4 writes data (write data) to a region corresponding to the write destination namespace (step S126). The controller 4 updates an LUT corresponding to the write destination namespace such that the physical address indicating the physical storage location to which the write data is written is mapped to the logical address (LBA) of the write data (step S127).

The flowchart of FIG. 19 illustrates an example of the procedure of a refresh process.

The controller 4 of the SSD 3 detects a block which satisfies a refresh condition from a group of blocks corresponding to the namespace in which a virtual machine image is stored, in other words, from the group of blocks in which a virtual machine image is stored (step S131). The controller 4 reads data in page units from the detected block and corrects the error of the read data, using the ECC circuit 15 (step S132). In step S132, the error of all the page data of the detected block is corrected. The controller 4 applies an erase operation to the detected block to let all the memory cells of the detected block into an erase state (step S133). The controller 4 writes all the corrected page data back to the detected block (step S134).

The flowchart of FIG. 20 illustrates another example of the procedure of a refresh process.

The controller 4 of the SSD 3 detects a block which satisfies a refresh condition from a group of blocks corresponding to the namespace in which a virtual machine image is stored, in other words, from the group of blocks in which a virtual machine image is stored (step S141). The controller 4 reads data in page units from the detected block and corrects the error of the read data, using the ECC circuit 15 (step S142). In step S142, the error of all the page data of the detected block is corrected.

The controller 4 determines whether or not the bit error rate or the number of reads of the detected block is greater than or equal to a threshold for data move (step S143). This threshold is a threshold for determining whether or not the corrected data should be moved to a block different from the detected block.

When the bit error rate or the number of reads of the detected block is less than the threshold (NO in step S143), the controller 4 applies an erase operation to the detected block to let all the memory cells of the detected block into an erase state (step S144). The controller 4 writes all the corrected page data back to the detected block (step S145).

When the bit error rate or the number of reads of the detected block is greater than or equal to the threshold (YES in step S143), the controller 4 writes all the corrected page data to a block (move destination block) different from the detected block (step S146). The controller 4 updates the block address translation table T1 and stores the block address of the move destination block in the block address translation table T1 such that the block address of the detected block is translated into the block address of the move destination block (step S147). In step S147, the block address of the move destination block is stored in an entry corresponding to the block address of the detected block.

In the above explanation, only when the bit error rate or the number of reads of the detected block is greater than or equal to the threshold, the corrected data is written to a block (move destination block) different from the detected block, and further, the block address translation table T1 is updated. However, regardless of the bit error rate or the number of reads of the detected block, the corrected data may be written to a block (move destination block) different from the detected block, and further, the block address translation table T1 may be updated. After an erase operation is applied to the detected block, the block may transition to a bad block. In this case, similarly, the corrected data may be written to a block (move destination block) different from the detected block, and further, the block address translation table T1 may be updated.

Figure 21:
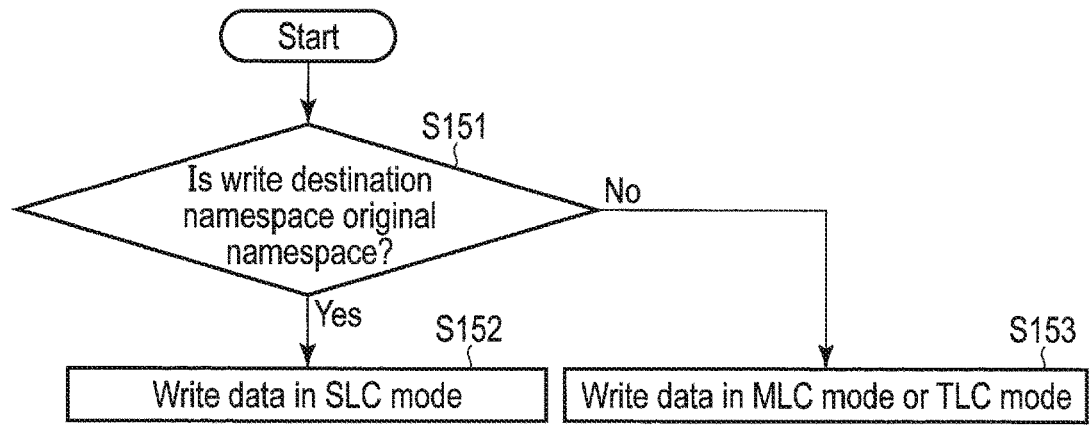
FIG. 21 is a flowchart illustrating the procedure of a data write process performed by the memory system of the embodiment.

The flowchart of FIG. 21 illustrates the procedure of a process for writing data to region #1 (the original namespace in which an original virtual machine image is stored) in the first write mode for writing data of 1 bit per memory cell and writing data to region #31 (or region #32) in the second write mode for writing data of a plurality of bits per memory cell.

The controller 4 of the SSD 3 determines whether or not the write destination namespace is the original namespace (region #1 or region #2) in which an original virtual machine image should be stored (step S151).

When the write destination namespace is an original namespace (region #1 or region #2), the controller 4 writes data (here, the binary image of an operating system, etc.) to the original namespace (region #1 or region #2) in a write mode (SLC mode) for writing data of 1 bit per memory cell (step S152). In other words, the controller 4 writes data to region #1 or region #2, using a write mode (SLC mode) for writing data of 1 bit per memory cell.

When the write destination namespace is a namespace (region #31, region #32 or region #33) used as a virtual storage for a virtual machine, the controller 4 writes data to the namespace (region #31, region #32 or region #33) used as a virtual storage in a write mode (an MLC mode or a TLC mode) for writing data of a plurality of bits per memory cell (step S153). In other words, the controller 4 writes data to region #31 or region #32, using a write mode (an MLC mode or a TLC mode) for writing data of a plurality of bits per memory cell.

Figure 22:
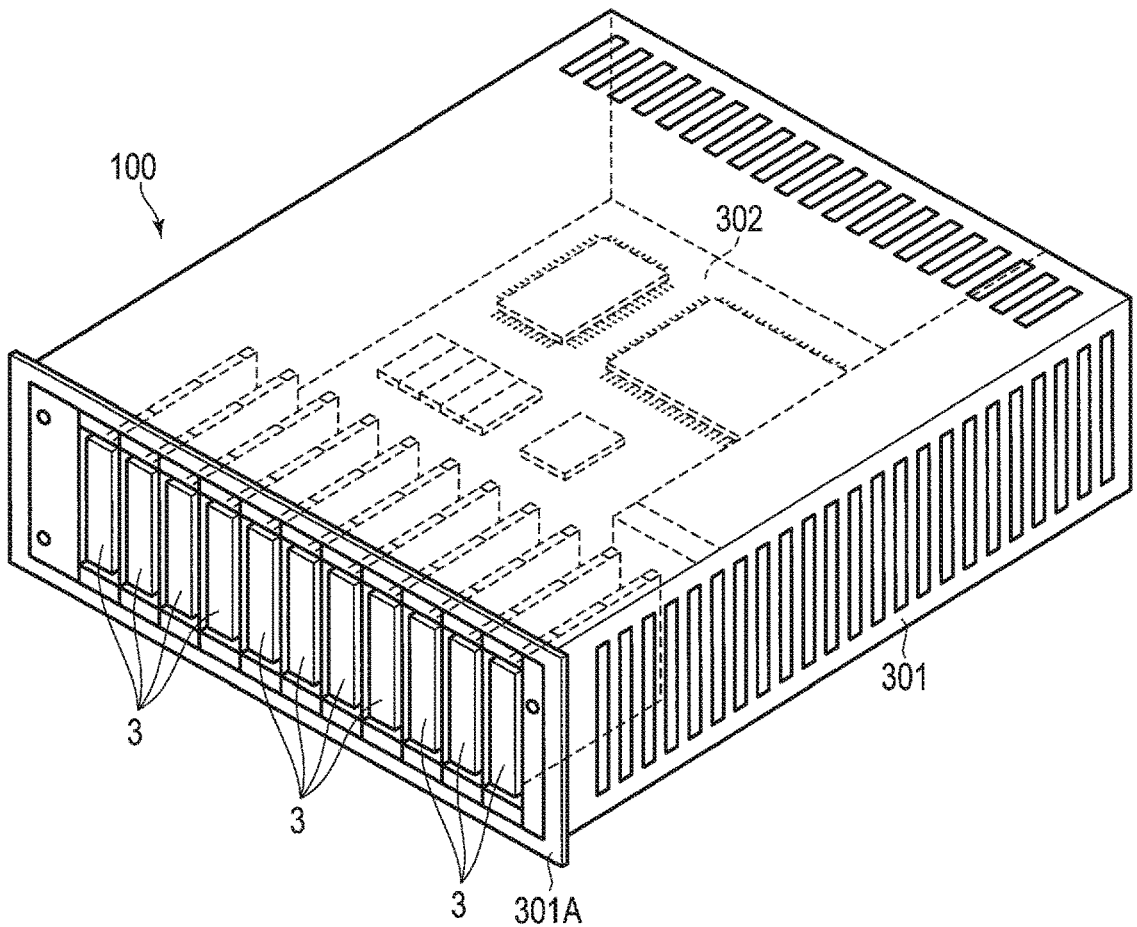
FIG. 22 illustrates a structural example of the server (host computing device) including the memory system of the embodiment.

FIG. 22 illustrates a structural example of the server (host computing device) 100 including a plurality of SSDs 3.

A data processing device which functions as the server (host computing device) 100 comprises a housing 301 which can be put into a rack and has a thin-box shape. A large number of SSDs 3 may be provided in the housing 301. In this case, each SSD may be removably inserted into a corresponding slot provided on the front surface 301A of the housing 301.

A system board (mother board) 302 is provided in the housing 301. Various electronic components including a physical CPU, a physical memory and a physical NIC are mounted on the system board (mother board) 302.

As explained above, in the present embodiment, in response to a request from the server (host computing device) 100, the content of LUT #1 corresponding to region #1 in which original data (first data) is stored is copied to LUT #31 corresponding to region #31. Every time a read request specifying a logical address in region #31 is received from the server (host computing device) 100, the first data is partially read from region #1 and is returned to the server (host computing device) 100 based on LUT #31. Thus, the first data stored in region #1 can be read-accessed via each logical address of region #31 without copying the first data stored in region #1 to region #31.

When a write request specifying a logical address in region #31 is received from the server (host computing device) 100, the second data to be written is written to region #31. Further, LUT #31 is updated such that the physical address indicating the physical storage location to which the second data is written in region #31 is mapped to the logical address specified by the write request. Since LUT #31 is updated in this way, when a read request for the second data is received from the server (host computing device) 100 after the second data is written to region #31, the second data can be read from region #31 and returned to the server (host computing device) 100 based on the updated LUT #31. Thus, the data to be written is written to region #31, and the data written to region #31 is read from region #31. Even when the original data (first data) of region #1 is shared by a plurality of regions (region #31, region #32, . . . ), no contradiction is generated. As region #1 is mainly used for reading, the few rewrites of region #1 can be maintained.

A block which satisfies a refresh condition is detected from the group of blocks allocated to a first region. The error of the data of the detected block is corrected. The corrected data is written back to the detected block. Thus, the refresh operation of the first region can be performed without updating LUT #1 or LUT #31. Very few rewrites are applied to each block allocated to region #1. Thus, even if the corrected data is written back to the detected block, the number of rewrites (program/erase cycles) of the block does not come close to a limit value. In the improved refresh operation, corrected data is written back to the detected block. Thus, it is possible to effectively improve the reliability of the blocks allocated to region #1.

In the present embodiment, a NAND flash memory is exemplarily shown as a nonvolatile memory. However, the function of the present embodiment may be applied to various other nonvolatile memories such as a magnetoresistive random access memory (MRAM), a phase change random access memory (PRAM), a resistive random access memory (ReRAM) or a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, the memory system comprising:
   a nonvolatile memory including a first region and a second region, the first region including a first plurality of blocks, the second region including a second plurality of blocks, each of the first plurality of blocks and the second plurality of blocks being a unit for a data erase operation; and
   a controller electrically connected to the nonvolatile memory and configured to:
   manage a first logical address space and a second logical address space;
   store first data into a first block of the first region;
   generate a first logical-to-physical address translation table such that logical addresses of the first logical address space are mapped with physical addresses of the first plurality of blocks of the first region;
   generate a second logical-to-physical address translation table such that logical addresses of the second logical address space are mapped with the physical addresses of the first plurality of blocks of the first region;
   in response to receiving a read request from the host, the read request specifying a logical address of the second logical address space, read at least a part of the first data from the first region on the basis of the second logical-to-physical address translation table; and
   in response to receiving a write request from the host, the write request specifying a logical address of the second logical address space,
     write second data into a second block of the second region, the second data being not stored in the first region, and
     update only the second logical-to-physical address translation table among the first logical-to-physical address translation table and the second logical-to-physical address translation table such that the logical address specified by the write request is mapped with a physical address of the second block of the second region.

2. The memory system according to claim 1, wherein the controller is further configured to:
   manage a first physical-to-physical address translation table; and
   in a case where the first data is moved to a third block of the first region, update the first physical-to-physical address translation table such that, both in the first logical-to-physical address translation table and in the second logical-to-physical address translation table, a logical address associated with the first data is mapped with a physical address of the third block of the first region, without updating the first logical-to-physical address translation table and the second logical-to-physical address translation table.

3. The memory system according to claim 2, wherein the controller is configured to move the first data from the first block to the third block in a first refresh operation.

4. The memory system according to claim 3, wherein the controller is further configured to perform a second refresh operation in which the controller:
reads the first data from the first block;
perform an error correction operation to the read first data;
perform the data erase operation to the first block; and
writes the error-corrected first data into the data-erased first block.

5. The memory system according to claim 4, wherein the controller is configured to:
perform the second refresh operation in a case where a bit error rate of the first block is lower than a threshold; and
perform the first refresh operation in a case where the bit error rate of the first block is equal to or higher than the threshold.

6. The memory system according to claim 1, wherein the controller is configured to:
store the first data into the first block of the first region in a first write mode; and
write the second data into the second block of the second region in a second write mode, wherein
the number of bits stored in one memory cell in the first write mode is smaller than the number of bits stored in one memory cell in the second write mode.

7. The memory system according to claim 1, wherein the first logical address space is a first namespace and the second logical address space is a second namespace.

8. The memory system according to claim 1, wherein the number of blocks of the first region is smaller than the number of blocks corresponding to the logical addresses of the first logical address space.

9. The memory system according to claim 1, wherein the number of blocks of the first region is smaller than the number of blocks of the second region.

10. The memory system according to claim 1, wherein the controller is further configured to,
after storing the first data into the first block of the first region, inhibit a write access from the host to the first logical address space.

11. A method of controlling a nonvolatile memory including a first region and a second region, the first region including a first plurality of blocks, the second region including a second plurality of blocks, each of the first plurality of blocks and the second plurality of blocks being a unit for a data erase operation, the method comprising:
managing a first logical address space and a second logical address space;
storing first data into a first block of the first region;
generating a first logical-to-physical address translation table such that logical addresses of the first logical address space are mapped with physical addresses of the first plurality of blocks of the first region;
generating a second logical-to-physical address translation table such that logical addresses of the second logical address space are mapped with the physical addresses of the first plurality of blocks of the first region;
in response to receiving a read request from a host, the read request specifying a logical address of the second logical address space, reading at least a part of the first data from the first region on the basis of the second logical-to-physical address translation table; and
in response to receiving a write request from the host, the write request specifying a logical address of the second logical address space,
writing second data into a second block of the second region, the second data being not stored in the first region, and
updating only the second logical-to-physical address translation table among the first logical-to-physical address translation table and the second logical-to-physical address translation table such that the logical address specified by the write request is mapped with a physical address of the second block of the second region.

12. The method according to claim 11, further comprising:
managing a first physical-to-physical address translation table; and
in a case where the first data is moved to a third block of the first region, updating the first physical-to-physical address translation table such that, both in the first logical-to-physical address translation table and in the second logical-to-physical address translation table, a logical address associated with the first data is mapped with a physical address of the third block of the first region, without updating the first logical-to-physical address translation table and the second logical-to-physical address translation table.

13. The method according to claim 12, wherein the first data are moved from the first block to the third block in a first refresh operation.

14. The method according to claim 13, further comprising performing a second refresh operation, wherein the performing the second refresh operation includes:
reading the first data from the first block;
performing an error correction operation to the read first data;
performing the data erase operation to the first block; and
writing the error-corrected first data into the data-erased first block.

15. The method according to claim 14, wherein
the second refresh operation is performed in a case where a bit error rate of the first block is lower than a threshold; and
the first refresh operation is performed in a case where the bit error rate of the first block is equal to or higher than the threshold.

16. The method according to claim 11, wherein
the storing includes storing the first data into the first block of the first region in a first write mode; and
the writing includes writing the second data into the second block of the second region in a second write mode, wherein
the number of bits stored in one memory cell in the first write mode is smaller than the number of bits stored in one memory cell in the second write mode.

17. The method according to claim 11, wherein the first logical address space is a first namespace and the second logical address space is a second namespace.

18. The method according to claim 11, wherein the number of blocks of the first region is smaller than the number of blocks corresponding to the logical addresses of the first logical address space.

19. The method according to claim 11, wherein the number of blocks of the first region is smaller than the number of blocks of the second region.

20. The method according to claim 11, further comprising, after storing the first data into the first block of the first region, inhibiting a write access from the host to the first logical address space.

* * * * *